US011126766B2

(12) United States Patent
Makem et al.

(10) Patent No.: US 11,126,766 B2
(45) Date of Patent: Sep. 21, 2021

(54) SYSTEM AND METHOD FOR ELEMENT QUALITY IMPROVEMENT IN 3D QUADRILATERAL-DOMINANT SURFACE MESHES

(71) Applicant: Siemens Industry Software Inc., Plano, TX (US)

(72) Inventors: Jonathan Makem, Cambridge (GB); Nilanjan Mukherjee, Cincinnati, OH (US)

(73) Assignee: Siemens Industry Software Inc., Plano, TX (US)

( * ) Notice: Subject to any disclaimer, the term of this patent is extended or adjusted under 35 U.S.C. 154(b) by 366 days.

(21) Appl. No.: 16/336,641

(22) PCT Filed: Oct. 31, 2016

(86) PCT No.: PCT/US2016/059631
§ 371 (c)(1),
(2) Date: Mar. 26, 2019

(87) PCT Pub. No.: WO2018/080527
PCT Pub. Date: May 3, 2018

(65) Prior Publication Data
US 2021/0103685 A1 Apr. 8, 2021

(51) Int. Cl.
*G06F 30/23* (2020.01)
*G06F 30/12* (2020.01)

(52) U.S. Cl.
CPC .............. *G06F 30/23* (2020.01); *G06F 30/12* (2020.01)

(58) Field of Classification Search
CPC ...................................... G06F 30/23
(Continued)

(56) References Cited

U.S. PATENT DOCUMENTS 6,970,165 B2   11/2005   Wollny et al.
7,339,584 B1   3/2008   Shepard et al.
(Continued)

FOREIGN PATENT DOCUMENTS

CN   1822051 A   8/2006
CN   104680573 A   6/2015
(Continued)

OTHER PUBLICATIONS

Mukherjee Nilanjan Et Al: "A 3D Constrained Optimization Smoother to Post-process Quadrilateral Meshes for Body-in-white", Procedia Engineering—25th International Meshing Roundtable (I RM25), vol. 163, Sep. 30, 2016, pp. 262-275.
(Continued)

*Primary Examiner* — Eric D Lee

(57) ABSTRACT

A system and method is provided for element quality improvement in three-dimensional (3D) quadrilateral-dominant surface meshes. The system may include a processor configured to collapse a first plurality of edges of a plurality of quadrilateral elements that form a surface mesh of a 3D model, which edges have lengths that are shorter than a predetermined fraction of a minimum element edge length (MEL). Further, the processor may also move nodes connected to at least some of a second plurality of edges of the plurality of quadrilateral elements so as to have lengths that are at least the MEL. Also, the processor may adjust included angles and the warp of elements to be within predetermined limits. Further, the processor may collapse in the mesh all remaining edges of the plurality of quadrilateral elements that are shorter than the MEL to produce a modified surface mesh in which all quadrilaterals in the modified mesh have edge lengths that are at least the MEL.

20 Claims, 14 Drawing Sheets

(58) Field of Classification Search
USPC .................................................... 703/2
See application file for complete search history.

(56) References Cited

U.S. PATENT DOCUMENTS

| | | | |
|---|---|---|---|
| 7,443,393 B2 | 10/2008 | Shen et al. | |
| 9,082,220 B2 | 7/2015 | Mukherjee | |
| 2004/0119711 A1* | 6/2004 | Wollny | G06T 17/20 345/423 |
| 2007/0165025 A1 | 7/2007 | Shen et al. | |
| 2018/0120478 A1* | 5/2018 | Imhof | G01V 99/005 |

FOREIGN PATENT DOCUMENTS

| | | |
|---|---|---|
| CN | 105006022 A | 10/2015 |
| EP | 0980048 A2 | 2/2000 |
| EP | 2905744 A1 | 8/2015 |
| WO | 0042575 | 7/2000 |

OTHER PUBLICATIONS

Canann et al., "An Approach to Combined Laplacian and Optimization-Based Smoothing for Triangular, Quadrilateral, and Quad-Dominant Meshes", ANSYS, Inc. 1998 (16 Pages).
Blacker et al, "Paving: A New Approach to Automated Quadrilateral Mesh Generation"; International Journal of Numerical Methods in Engineering; 1991; vol. 32.; pp. 811-847.
Zhu et al., "New Approach to the Development of Automatic Quadrilateral Mesh Generation"; International Journal of Numerical Methods in Engineering; 1991; vol. 32; pp. 849-866.
Lori A. Freitag and Carl Olivier-Gooch "A Comparison of Tetrahedral Mesh Improvement Techniques", Mathematics and Computer Science Division, Argonne National Laboratory, 1997. 14 Pages.
Lori A. Freitag, "On Combining Laplacian and Optimization-Based Mesh Smoothing Techniques", Mathematics and Computer Science Division, Argonne National Laboratory, 1997, 1-8 pgs.
S.H. Lo, "A New Mesh Generation Scheme for Arbitrary Domains", International Journal of Numerical Methods in Engineering, 1985; vol. 21; pp. 1403-1426.
Patrick M. Knupp, "Achieving Finite Element Mesh Quality Via Optimization of the Jacobian Matrix Norm and Associated Quantities. Part I—A Framework for SurfaceMesh Optimization"; International Journal of Numerical Methods in Engineering; 2000; vol. 48; pp. 401-420.
M. Berzins, "Mesh Quality: A Function of Geometry, Error Estimates or Both?"; Proceedings of the 7th International Meshing Roundtable; 1998, pp. 1-12.
S.H. Lo, "Generating Quadrilateral Elements on Plane and Over Curved Surfaces"; Computers and Structures; 1989; vol. 31; pp. 421-426.
Tian Zhou and Kenji Shimada, "An Angle-Based Approach to Two-Dimensional Mesh Smoothing", Proceedings of the 9th International Meshing Roundtable; 2000, pp. 1-12.
Hongtao Xu and Timothy S. Newman, "2D FE Quad Mesh Smoothing via Angle-Based Optimization"; Proceedings of the 5th International Conference on Computational Science; 2005; pp. 9-16.
V.N. Parthasarathy and Srinivas Kodiyalam, "A Constrained Optimization Approach to Finite Element Mesh Smoothing", Published in Finite Elements in Analysis and Design, vol. 9, 1991, pp. 309-320.
Lohner et al., "Adaptive Grid Refinement for the Compressible Euler Equations"; Accuracy Estimates and Adaptive Refinements in Finite Element Computations; Wiley; 1986; pp. 281-297.
Kenji Shimada, "Physically-Based Mesh Generation: Automated triangulation of Surfaces and Volumes via Bubble Packing"; Ph.D. thesis, ME Dept.; Massachusetts Institute of Technology; Cambridge, MA; 1993, pp. 1-180.
Kenji Shimada and David C. Gossard, "Bubble Mesh: Automated Triangular Meshing of Non-Manifold Geometry by Sphere Packing"; In ACM Third Symposium on Solid Modeling and Applications; May 1995; pp. 409-419.
Kenji Shimada et al., "Anisotropic Triangular Meshing of Parametric Surfaces via Close Packing of Ellipsoidal Bubbles"; Proceedings of the Sixth International Meshing Roundtable; Sandia National Laboratories; 1997; pp. 375-390.
Frank J. Bossen and Paul S. Heckbert, "A Pliant Method for Anisotropic Mesh Generation", Computer Science Dept., Carnegie Mellon University, 1996, 12 Pages.
K. Beatty and N. Mukherjee, "Flattening 3D Triangulations for Quality Surface Mesh Generation", Proc. 17th International Meshing Roundtable, Springer, 2008, pp. 125-139.
K. Beatty and N. Mukherjee, "A Transfinite Meshing Approach for Body-In-White Analyses", Proc. 19th International Meshing Roundtable, Springer, 2010, pp. 49-65.
M.J.D. Powell, "An efficient method for finding the minimum of a function of several variables without calculating derivatives"; Computer Journal, 1964, pp. 155-162.

* cited by examiner

FIG. 2
| Mesh Quality Metric | Description |
|---|---|
| Element Edge Length (mm) | 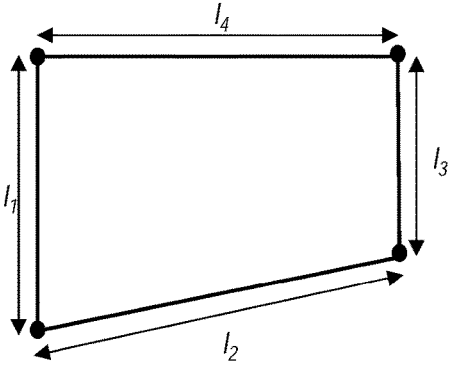 202 |
| Element Included Angle (Degrees) | 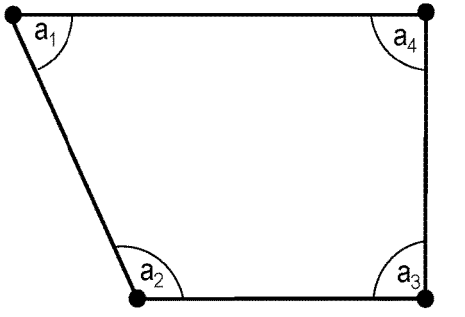 204 |
| Warp (Nastran Version - Unitless) | 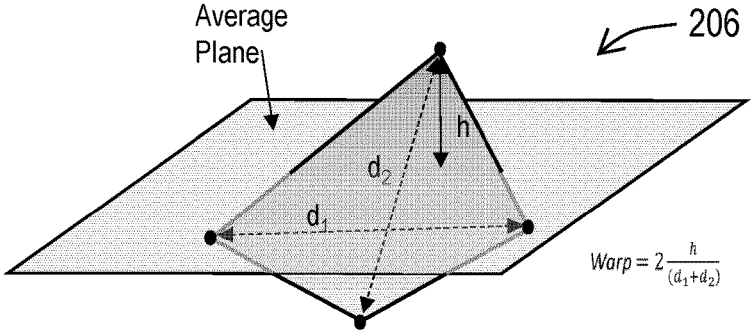 206 $Warp = 2\frac{h}{(d_1+d_2)}$ |

SYSTEM AND METHOD FOR ELEMENT QUALITY IMPROVEMENT IN 3D QUADRILATERAL-DOMINANT SURFACE MESHES

TECHNICAL FIELD

The present disclosure is directed, in general, to computer-aided design (CAD), computer-aided manufacturing (CAM), computer-aided engineering (CAE), visualization, simulation, and manufacturing systems, product data management (PDM) systems, product lifecycle management (PLM) systems, and similar systems, that are used to create, use, and manage data for products and other items (collectively referred to herein as product systems).

BACKGROUND

Product systems may be used to generate three-dimensional (3D) meshes of geometric models of products. Such systems may benefit from improvements.

SUMMARY

Variously disclosed embodiments include data processing systems and methods that may be used to facilitate element quality improvement in 3D quadrilateral-dominant surface meshes.

In one example, a system may comprise at least one processor configured to determine a first plurality of edges of a plurality of quadrilateral elements that form a surface mesh of a 3D model, which edges have lengths that are shorter than a first predetermined minimum element edge length. The at least one processor may also be configured to collapse in the mesh the determined first plurality of edges to convert each quadrilateral element that included a respective one of the collapsed first plurality of edges into a respective triangular element. Also, the at least one processor may be configured (after the first plurality of edges are collapsed) to determine a second plurality of edges of the plurality of quadrilateral elements that are shorter than a second predetermined minimum element edge length and that are longer than the first predetermined minimum element edge length. In addition, the at least one processor may be configured to move in the mesh a plurality of nodes connected to at least some of the second plurality of edges so that at least some of the second plurality of edges have lengths that are at least the second predetermined minimum element edge length. Further, the at least one processor may be configured to: determine all remaining edges of the plurality of quadrilateral elements that are shorter than the second predetermined minimum element edge length; and collapse in the mesh the determined remaining edges to convert each quadrilateral element that included a respective collapsed one of the remaining edges into a respective triangular element. By these functions, the at least one processor produces a modified surface mesh in which all quadrilaterals in the modified mesh have edge lengths that are at least the second predetermined minimum element edge length.

In another example, a method for element quality improvement in three-dimensional (3D) quadrilateral-dominant surface meshes may comprise several acts carried out through operation of at least one processor. These acts may include determining a first plurality of edges of a plurality of quadrilateral elements that form a surface mesh of a 3D model, which edges have lengths that are shorter than a first predetermined minimum element edge length. These acts may also include collapsing in the mesh the determined first plurality of edges to convert each quadrilateral element that included a respective one of the collapsed first plurality of edges into a respective triangular element. In addition, these acts may include determining a second plurality of edges of the plurality of quadrilateral elements that are shorter than a second predetermined minimum element edge length that are longer than the first predetermined minimum element edge length. Further, these acts may include moving in the mesh a plurality of nodes connected to at least some of the second plurality of edges so that at least some of the second plurality of edges have lengths that are at least the second predetermined minimum element edge length. Also, the acts may include determining all remaining edges of the plurality of quadrilateral elements that are shorter than the second predetermined minimum element edge length. Further, the acts may include collapsing in the mesh the determined remaining edges to convert each quadrilateral element that included a respective collapsed one of the remaining edges into a respective triangular element. As a result of these acts, a modified surface mesh may be produced in which all quadrilaterals in the modified mesh have edge lengths that are at least the second predetermined minimum element edge length.

A further example may include a non-transitory computer readable medium encoded with executable instructions (such as a software component on a storage device) that when executed, causes at least one processor to carry out this described method.

Another example may include a product or apparatus including at least one hardware, software, and/or firmware based processor, computer, component, controller, means, module, and/or unit configured for carrying out functionality corresponding to this described method.

The foregoing has outlined rather broadly the technical features of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiments disclosed as a basis for modifying or designing other structures for carrying out the same purposes of the present disclosure. Those skilled in the art will also realize that such equivalent constructions do not depart from the spirit and scope of the disclosure in its broadest form.

Also, before undertaking the Detailed Description below, it should be understood that various definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

FIG. 2 illustrates an example table of mesh quality metrics.

DETAILED DESCRIPTION

Figure 1:
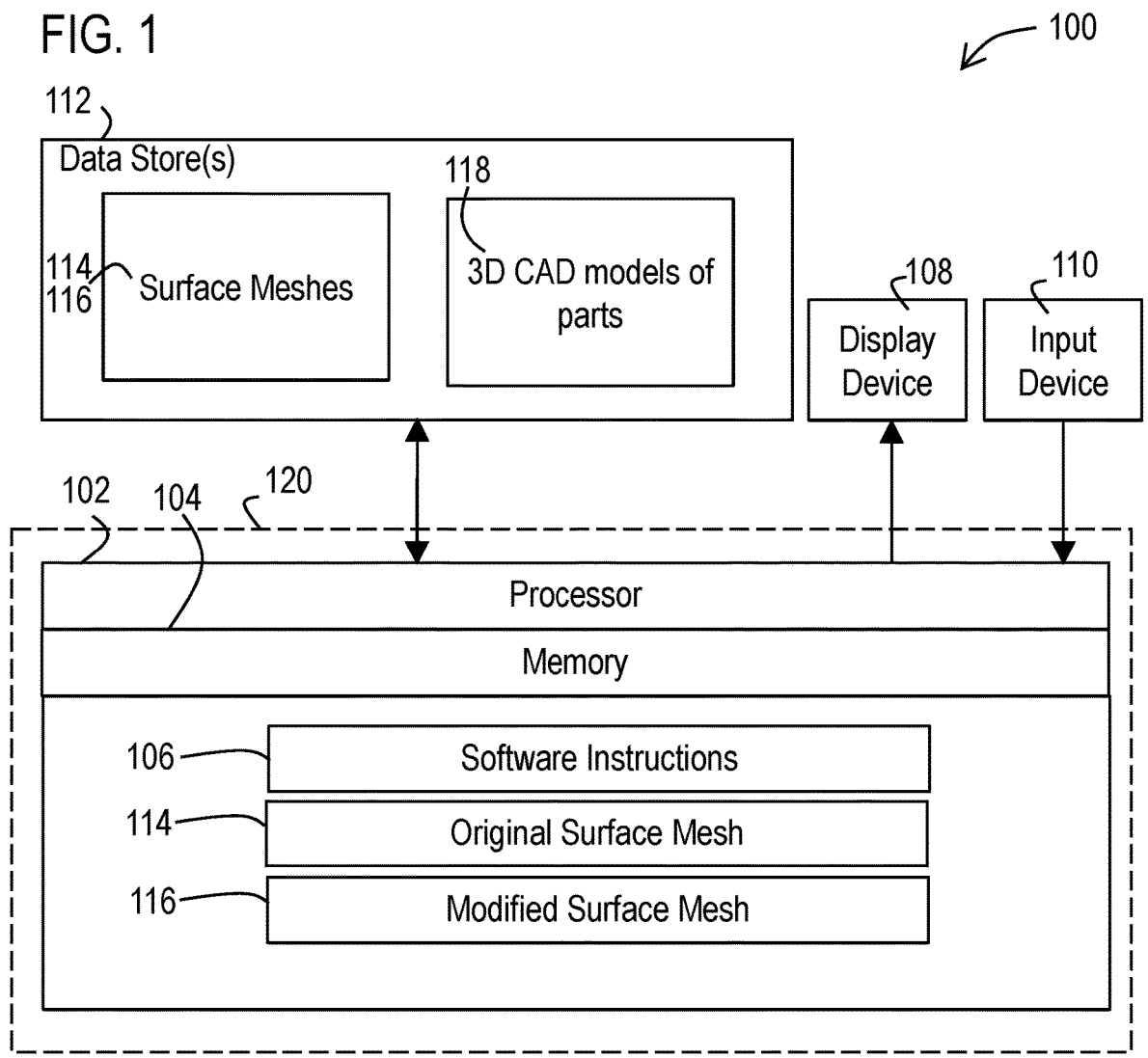
FIG. 1 illustrates a functional block diagram of an example system that facilitates element quality improvement in 3D quadrilateral-dominant surface meshes.

Various technologies that pertain to systems and methods that facilitate element quality improvement in 3D quadrilateral-dominant surface meshes will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

With reference to FIG. 1, an example data processing system 100 is illustrated that facilitates element quality improvement in 3D quadrilateral-dominant surface meshes. The system 100 may include at least one processor 102 (e.g., a microprocessor or CPU) that is configured to carry out various processes and functions described herein via software instructions 106 (included in at least one application software component) that are accessed by the processor from a memory 104 and executed by the processor. Such a memory 104 may correspond to an internal or external volatile memory (e.g., CPU cache, RANI), that is included in the processor and/or in operative connection with the processor. Such a memory 104 may also correspond to a nonvolatile memory (e.g., flash memory, SSD, hard drive, or other storage device or non-transitory computer readable media) in operative connection with the processor.

It should be understood that a processor that is described or claimed as being configured to carry out a particular described/claimed processes or function may correspond to the combination 120 of the processor 102 with the software instructions 106 loaded/installed into the described memory 104 (volatile and/or non-volatile), which are currently being executed and/or are available to be executed by the processor to cause the processor to carry out the described/claimed process or function. Thus a processor that is powered off or is executing other software, but has the described software instructions installed on a storage device in operative connection therewith (such as an SSD) in a manner that is setup to be executed by the processor (when started by a user, hardware and/or other software) may also correspond to a processor that is configured to carry out the particular processes and functions described/claimed herein regarding the configured processor. Further, it should be understood that a processor that is described or claimed as being configured to carry out a particular described/claimed processes or function may correspond to a microprocessor that is hard wired (e.g., an FPGA or ASIC microprocessor) to carry out such a described/claimed process or function.

The described data processing system 100 may include at least one display device 108 and at least one input device 110 in operative connection with the processor. The display device, for example, may include an LCD display screen, monitor, and/or a projector. The input devices, for example, may include a mouse, pointer, touch screen, touch pad, drawing tablet, track ball, buttons, keypad, keyboard, camera, motion sensing device that captures motion gestures, and/or any other type of input device capable of providing the inputs described herein. For example, the processor 102, memory 104, software instructions 106, display device 108, and input device 110, may be included as part of a data processing system corresponding to a PC, workstation, server, notebook computer, tablet, mobile phone, or any other type of computing system, or any combination thereof.

In an example embodiment, the described software instructions 106 may include and/or correspond to one or more components of a PLM software application that is configured to retrieve, generate, and store product data in a data store 112 such as a database (e.g., Oracle, Microsoft SQL Server), file system, hard drive, SSD, memory card and/or any other type of device or system that stores non-volatile data.

Example embodiments may include software instructions 106 included by or used with PLM software such as computer-aided-engineering software (CAE) software and/or any other software that uses meshes of 3D geometric models of parts in order to simulate characteristics of the parts. For example, such parts may correspond to body panels of a vehicle, and surface meshes generated from 3D models thereof may be used by simulation software to simulate how the body panel reacts to a simulated crash of the vehicle.

Examples of PLM software applications that may be adapted to carry out the features and functions described herein may include the NX suite of applications and/or Solid Edge software produced by Siemens Product Lifecycle Management Software Inc., of Plano, Tex., US. However, it should be appreciated that the systems and methods described herein may be used in other product systems and/or any other type of system that generates meshes.

As illustrated in FIG. 1, the at least one processor 102 may be configured (via the software instructions 106) to process a 3D quadrilateral-dominant surface mesh 114 in order to produce a modified surface mesh 116 that has improved element quality.

The original mesh 114 may be retrieved from the data store 112, and/or may be generated by the same at least one processor 102 by accessing and meshing a 3D geometric model 118 of a part (such as a 3D CAD model stored in the data store 112). The processor 102 (or a processor in another data processing system) may be configured to carry out a simulation involving the modified surface mesh 116. Such a simulation may involve a finite element analysis using the mesh in order to simulate how the part will respond to static and/or dynamic loads and/or other types of physical variables.

For example, in the automotive industry, body-in-white (BIW) refers to the fabricated (usually seam and/or tack welded) sheet-metal body panel components that form the vehicle's body. Body-in-white is a stage of the vehicle body prior to painting and before the moving parts (doors, hoods, fenders), the engine, chassis sub-assemblies, and trim (glass, seats, upholstery, electronics) have been mounted. Quadrilateral-dominant meshes may be created for these body panels for a variety of finite element analyses. The results of these analyses may be used by the vehicle designers for design validation and modification. It should be appreciated that if the quality of these finite elements generated by the mesher suffers, the analyses results become prone to errors.

A common deficiency of a surface meshing algorithms (used to generate meshes from geometric models) is the occurrence of poorly shaped, distorted elements, especially quadrilaterals (also referred to as quads or quad elements) as they are generally non-planar. Defects such as these are undesirable as they can significantly affect the accuracy of the finite element solution and in some cases diminish its computational efficiency.

There are a variety of contributing factors which may lead to the generation of an ill-formed element. These factors include topological and geometrical flaws on source CAD geometries. For example, with models of industrial complexity, it is quite usual to encounter small edges, undercuts, slivers and sharp regions, which will have a direct impact on the quality of the final mesh.

Other factors include mesh size. For a pre-defined element size which is normally specified by the user when generating a mesh, there are scenarios where the actual mesh size may deviate greatly from this value, thereby generating elements which are too small or too large. Smaller elements will impact the solver convergence rate where as a coarser mesh will affect the solution accuracy.

Further factors may include meshing algorithm limitations. For example, inherent restrictions or flaws in the meshing process may lead to geometrically deformed elements. Limitations or defects at different stages of the meshing process such as boundary discretization, flattening, paving, domain subdivision may lead to the formation of a poorly formed mesh.

The following describes aspects of the system 100 that may improve the quality of a quadrilateral-dominate mesh. With reference to the table 200 in FIG. 2, in example embodiments, element quality can be quantified in terms of a series of distortion and size metrics, namely:

element edge lengths, $l_{1 \ldots 4}$ (202);
element included angles, $\alpha_{1 \ldots 4}$ (204); and
element warp, w (206).

For each element, the element of the mesh is deemed to have failed if any of these measures violate the conditions defined in the following equations 1-3 respectively:

$$l_{1 \ldots 4} > d_{mel} \quad \text{Eq. 1}$$

$$d_{\alpha_{min}} \leq \alpha_{1 \ldots 4} \leq d_{\alpha_{max}} \quad \text{Eq. 2}$$

$$w < d_{warp} \quad \text{Eq. 3}$$

where $d_{mel}$ is the minimum element edge length (MEL), $d\alpha_{min}$ and $d\alpha_{max}$ are the minimum and maximum element included angles and $d_{warp}$ is the maximum element warp limit. Consequently, by improving these quality metrics for any defective element, it is possible to resolve the failure and thereby enhance the overall quality of the mesh.

To this end, an example embodiment of the described software instructions 106 may be configured to process the original quadrilateral-dominant surface mesh 114 in order to automatically improve its quality by addressing elements which violate the aforementioned distortion and size limits. Such software instructions 106 may be implemented as a fully integrated framework comprising one or more corrective software tools including intelligent algorithms that carry out various optimizations and smoothing schemes to post-process the original mesh 114 with the aim of resolving element failures in the modified mesh 116. Such software tools may also enable a user to specify predetermined values for these described distortion and size limits (e.g., $d_{mel}$, $d\alpha_{min}$, $d\alpha_{max}$, and $d_{warp}$) via a configuration file, graphical user interface menu, database entry, or via any other input of data through at least one input device 110.

An example embodiment of the software instructions 106 may cause the processor to eliminate such mesh failures by carrying out a constrained multi-staged smoothing algorithm which aims to resolve each quality failure in succession. An example overall framework for achieving this objective is represented in the form of a six-staged mesh quality improvement engine illustrated via the examples 300, 400, 500 shown in FIGS. 3-5

Figure 3:
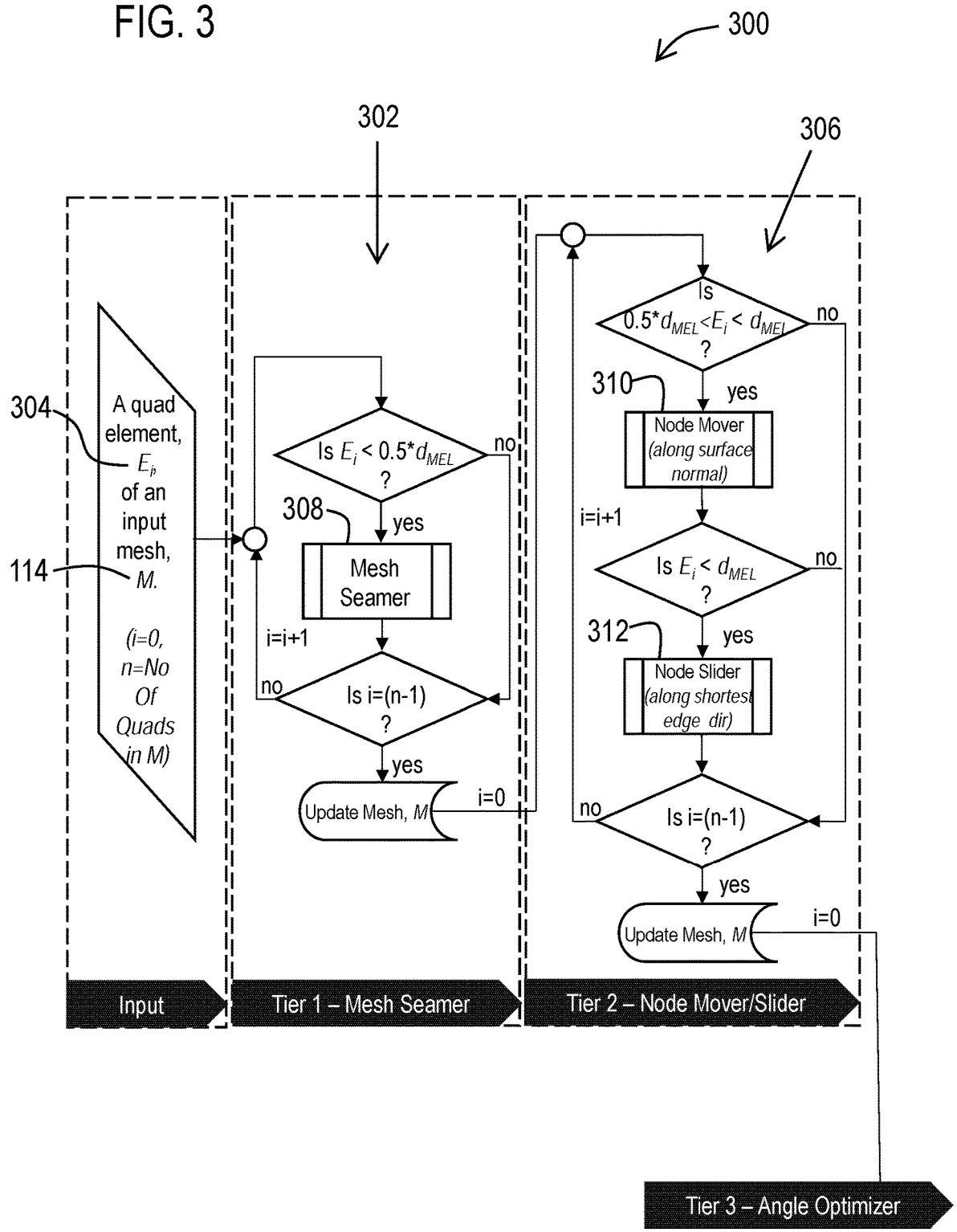
FIGS. 3-5 illustrate an example of a six-staged mesh quality improvement engine.

As illustrated in FIG. 3, in a first stage 302 a "Mesh Semler" software component 308 may be configured to receive a mesh (M) 114 comprising a plurality of quadrilateral elements (E) 304 as an input and in limited mode may be configured to collapse element edges that are very small (i.e., smaller than a predetermined fraction of the predetermined MEL). A second stage 306 may comprise a "Node Mover" software component 310 a "Node Slider" software component 312, which are configured to subsequently resolve elements in the updated mesh which violate the metric, MEL.

Figure 4:
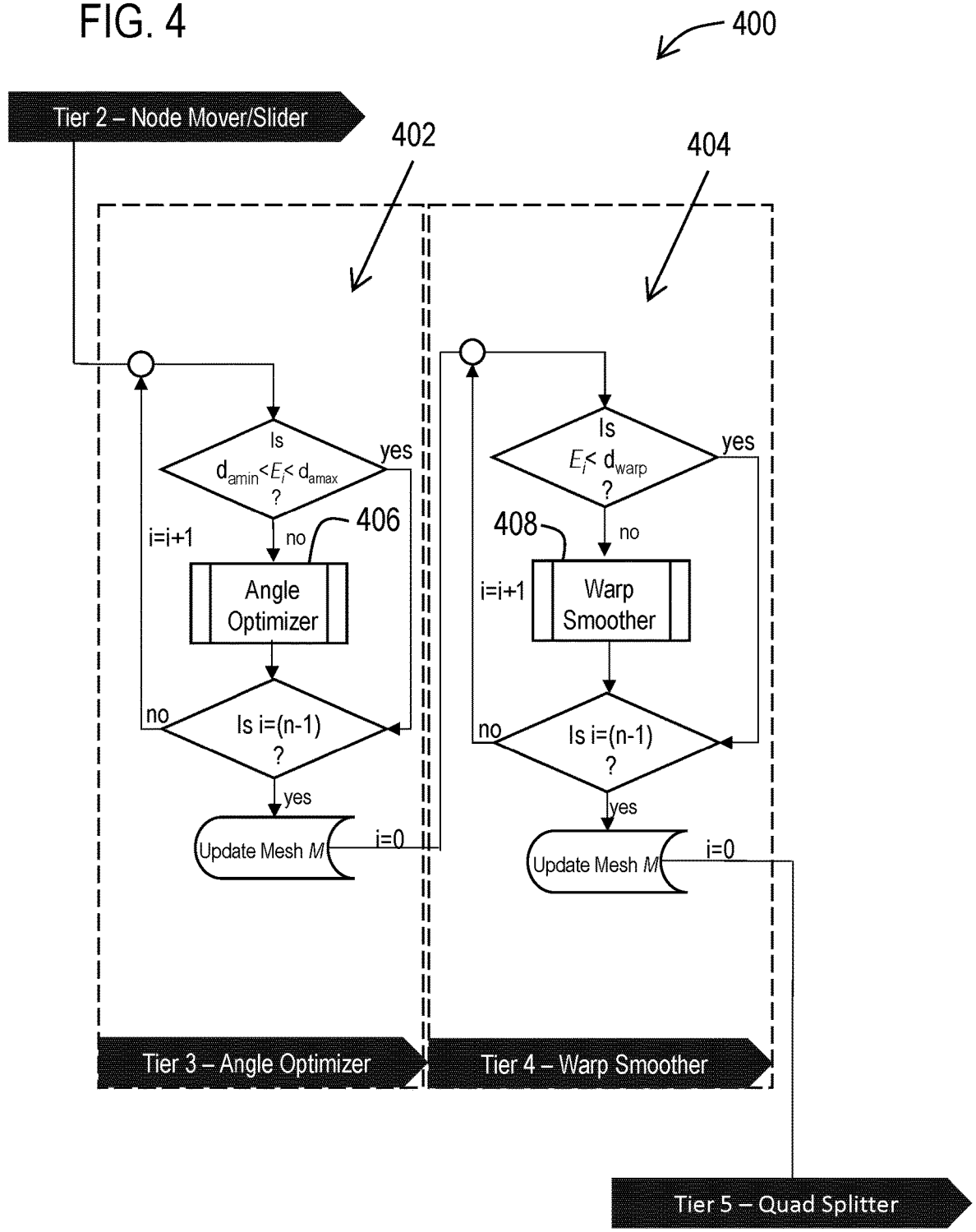

As illustrated in FIG. 4, the element included angle failures may be addressed in a third stage 402 by an "Angle Optimizer" software component 406. Also, in a fourth stage 404, any elements failing maximum element warp may be corrected by a "Warp Smoother" software component 408.

Figure 5:
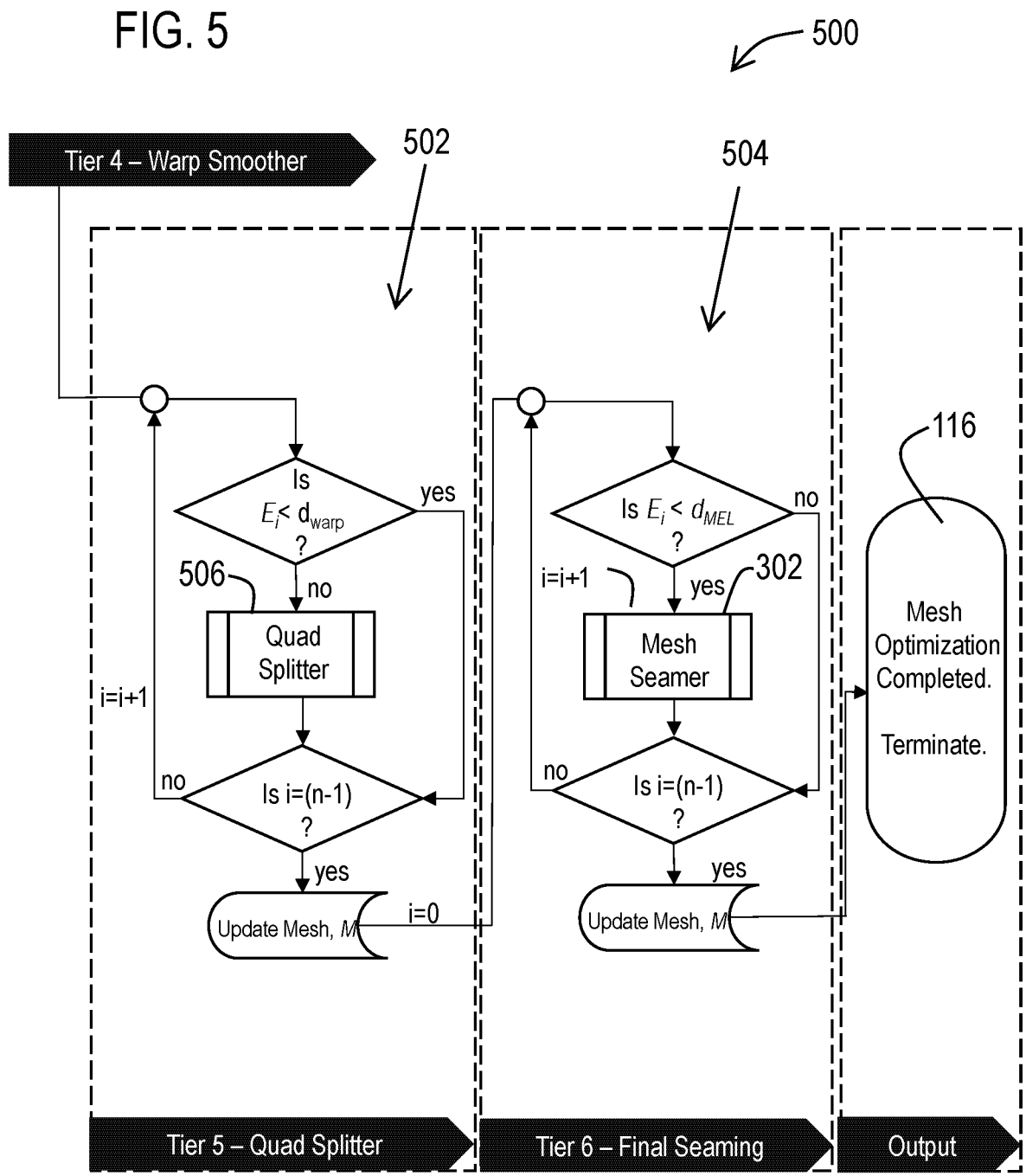

As illustrated in FIG. 5, a fifth stage 502 may comprise a "Quadrilateral Splitter" 506 software component that is configured to resolve certain residual quadrilateral element quality issues. Also, in the sixth stage 504, the Mesh Seamer software component 308 from the first stage 302 may be re-invoked in a more aggressive manner to resolve any remaining elements with MEL failures. After these described stages have been completed the described software framework may cause the processor 102 to output the modified mesh 116, to the memory 104, display screen 108, data store 112, storage device, simulation software, another software application, and/or any other software or hardware component that is capable of receiving, storing, using, or displaying a mesh.

The following describes in further detail technical aspects of these described stages. However, it should be appreciated that alternative embodiments may employ less, more and/or different stages depending on the mesh metrics that are most desirable for a give type of simulation that is to be carried out using the mesh modified via such stages.

For the first stage 302 of this described mesh quality improvement engine, the at least one processor 102 may be configured (e.g., via the Mesh Seamer software component 308) to determine a first plurality of edges of a plurality of quadrilateral elements that form a surface mesh of a 3D model, which edges have lengths 202 that are shorter than a first predetermined MEL. Such a first predetermined MEL may correspond to a predetermined fraction of a user specified MEL for the final mesh or may correspond to a separate configurable value. For this first stage, the at least one processor 102 may also be configured to collapse in the mesh the determined first plurality of edges to convert each quadrilateral element that included a respective one of the collapsed first plurality of edges into a respective triangular element.

Figure 6:
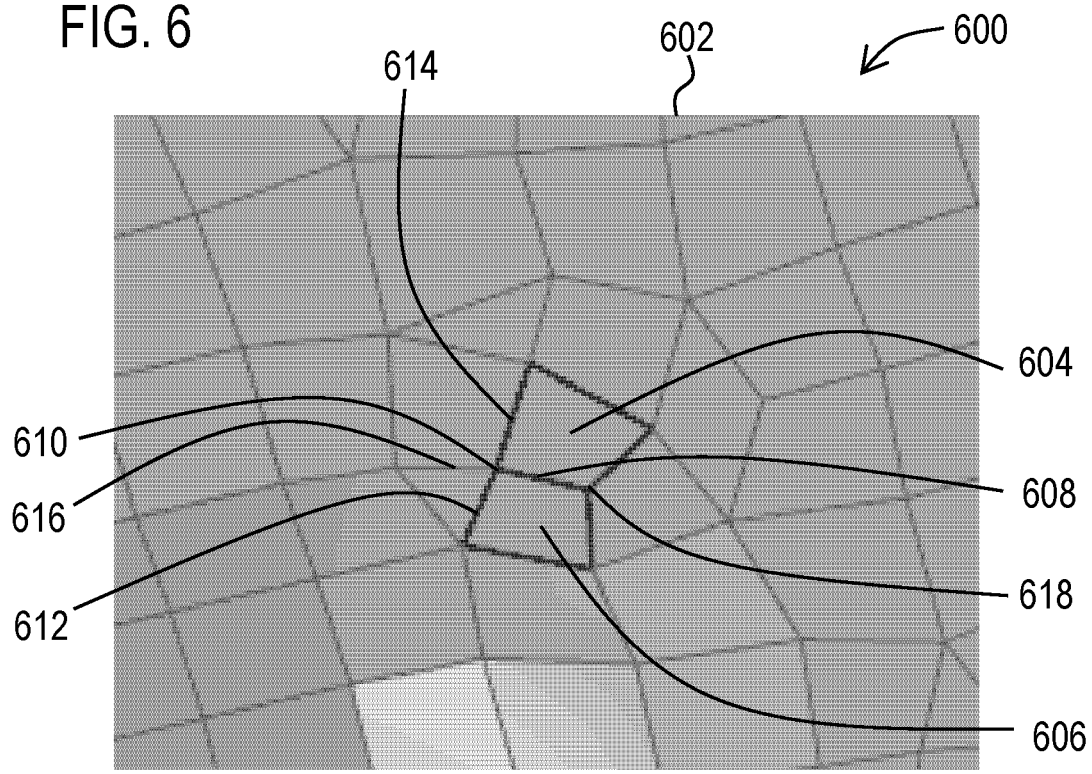
FIG. 6 illustrates an example of an element edge that fails a minimum element edge length (MEL) requirement.
Figure 7:
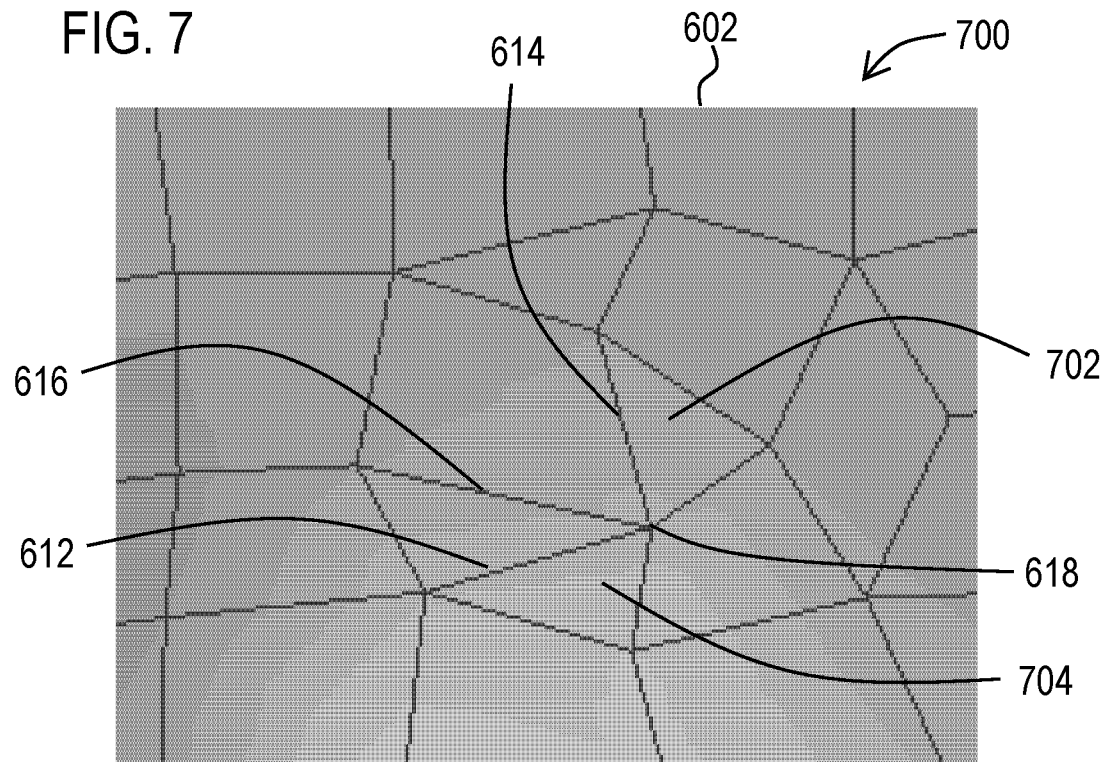
FIG. 7 illustrates an example of the mesh in FIG. 6 after the element edge has been collapsed to eliminate the MEL failure.

To carry out these functions, the previously described Mesh Seamer software component may address MEL failures by employing an edge-collapse mechanism in both individual and serial operations. FIG. 6 illustrates an example 600 of a portion of a mesh 602 in which two quadrilateral elements 604, 606 include a shared element edge 608 that fails (i.e., is shorter than) a first predetermined MEL. FIG. 7 illustrates an example 700 of a portion of the mesh 602 after an individual operation of the Mesh Seaming has collapsed the shared element edge 608 to eliminate a MEL failure.

As defined herein collapsing an edge corresponds to removing the edge. As illustrated in FIGS. 6 and 7, this results in removing the shared edge 608 and converting the two quadrilateral elements 604, 606 into triangular elements 702, 704. To carry this out, one of the nodes (such as node 610) of the edge 608 may be removed. The remaining edges 612, 614, 616 (previously connected to the removed node 610) may then be connected to the remaining node 618 of the removed edge 608.

Figure 8:
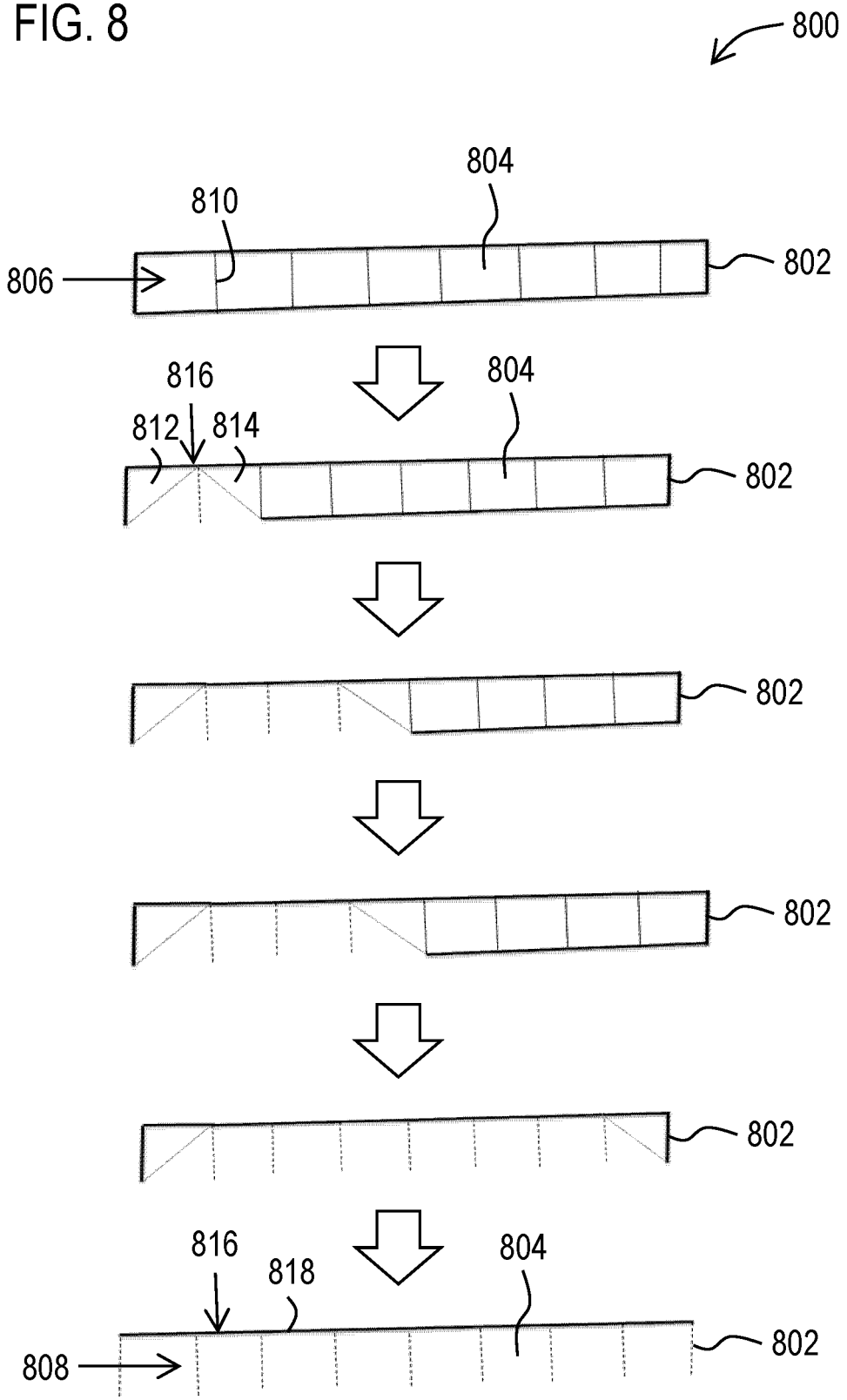
FIG. 8 illustrates a serial edge-collapse operation which results in the eight quadrilateral elements on a thin face being completely collapsed to eliminate MEL failure.

FIG. 8 illustrates an example 800 of a portion of a mesh 802 of a thin face 804 (such as a flange of a part) in which all of the quadrilateral elements 806 have edges which fail (i.e., are shorter than) the first predetermined MEL. FIG. 8 also illustrates a serial edge-collapse operation (carried out by the Mesh Seaming software component) which results in the eight quadrilateral elements 806 on the thin face being completely collapsed out as shown at 808, as all of the elements 806 have edges less than MEL.

For example, when a first edge 810 is collapsed two triangles 812, 814 are formed that meet on one edge side 816 of the face 804. As more quadrilateral edges collapse as shown moving downwardly in FIG. 8, more element edges are reduced to a single node on one side of the face. This results with the mesh 802 on the face 804 being reduced to a line of nodes 818 on the face boundary edge 816, with the mesh being deleted on the entire face 804.

In this example, the described Mesh Seamer is used with limited capability. It targets element edges that are less than 50% of $d_{mel}$. (e.g., the described first predetermined MEL may be 50% of a desired MEL for the mesh or other fraction thereof). This is done to prevent creation of too many triangles. Element edges between $(0.5\text{-}1.0)*d_{mel}$ may be addressed by the Node Mover software component in the described second stage.

For the second stage 306 of the described mesh quality improvement engine, the at least one processor 102 may be configured to determine a second plurality of edges of the plurality of quadrilateral elements that have lengths (202) that are shorter than a second predetermined MEL (such as the desired MEL $d_{mel}$ for the mesh which is longer than the first predetermined minimum element edge length). The at least one processor may also be configured to move in the mesh a plurality of nodes connected to at least some of the second plurality of edges so that at least some of the second plurality of edges have lengths that are at least the second predetermined MEL.

To carry out these functions, the previously described Node Mover and Node Slider software components 310, 312 may address MEL failures using respective first and second approaches in 3D space.

For example, in the first approach, the at least one processor may be configured (e.g., via the Node Mover software component 310) to move a first subset of the nodes (that do not meet the MEL) to new positions along determined respective surface normals at each respective node of the first subset, in order to cause each edge connected to each respective node of the first subset to have a length that is at least the second predetermined MEL (e.g., $d_{mel}$); and to have a length that is not longer than a largest edge in the quadrilateral elements that include the respective edge prior to the respective node of the first subset being moved.

Figure 9:
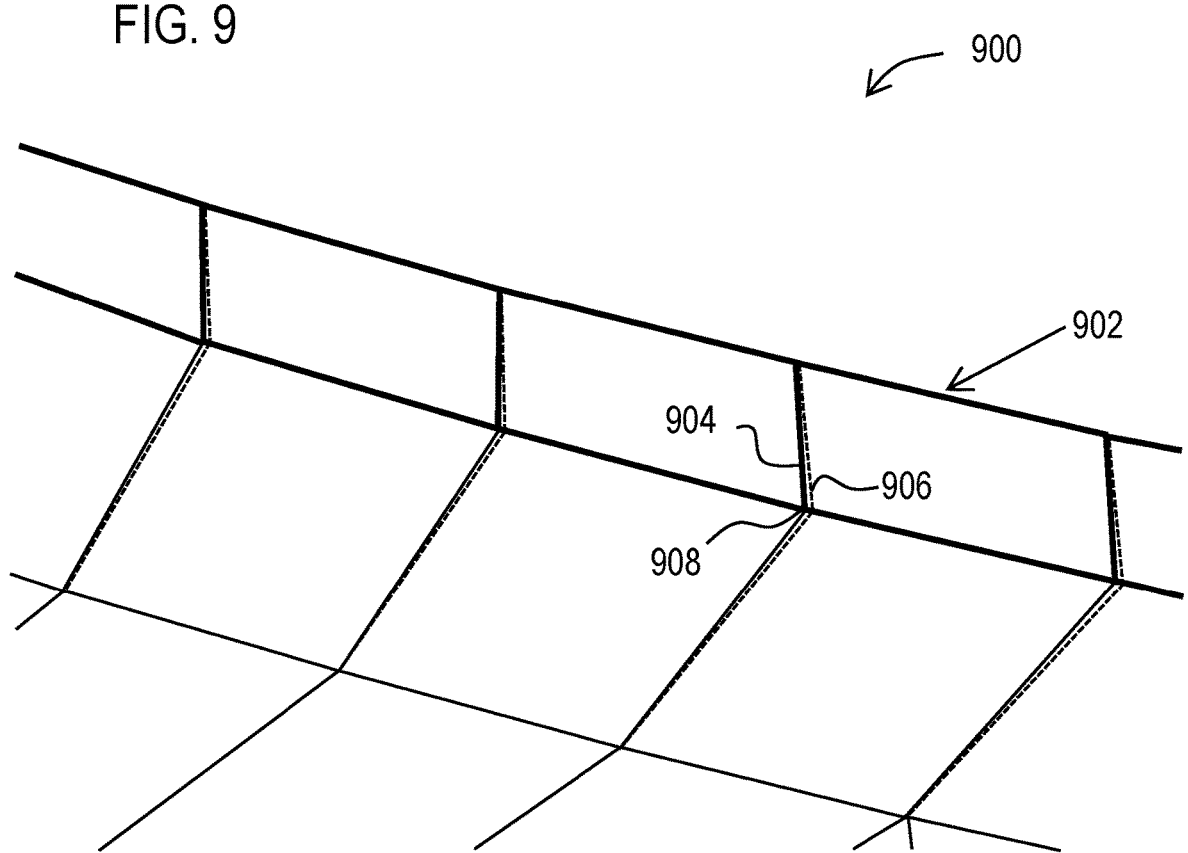
FIG. 9 illustrates edges of a mesh before and after nodes have been moved to remove MEL failures.

FIG. 9 illustrates edges of a mesh 900 with quadrilateral elements 902 (that fail MEL), before (in solid bold lines 904) and after (in broken lines 906) nodes 908 have been moved in this described manner to remove MEL failures.

Figure 10:
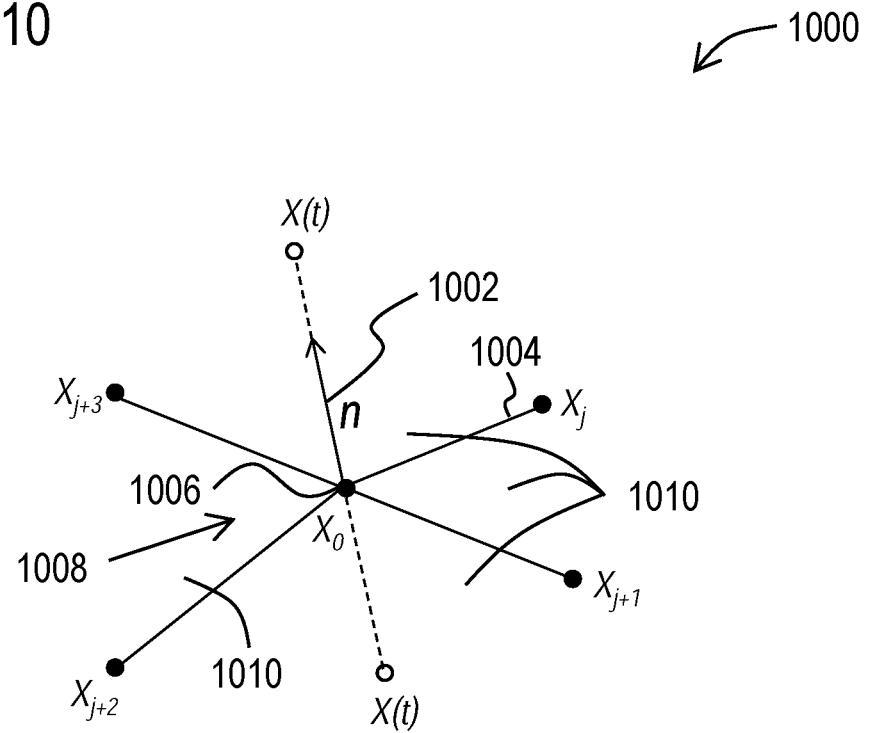
FIG. 10 illustrates the surface normal of a mesh that is computed using the area weighted average normal of the ring of elements surrounding a candidate node.

In this described first approach of the second stage 306, perturbation of a candidate node may be along a surface normal intersecting the node. FIG. 10 illustrates an example determination of a surface normal for a candidate node $X_0$ 1002 of an example mesh 1000 that is connected to an element edge 1004 that fails MEL. In this example, the surface normal (generally indicated 1008) is the plane intersecting candidate node $X_0$ 1002 that is orientated such that a direction normal to the plane corresponds to the weighted average normal, n 1006, of the ring of elements 1010 surrounding the candidate node, $X_0$ 1002.

Here the objective is to find the range of t such that:

$$\|X(t)-X_j\|^2 \geq d_{mel}^2 \qquad \text{Eq. 4}$$

Where $d_{mel}$=MEL. The solution to this problem may be formulated as:

$$X(t) - X_j = \begin{bmatrix} (x_0 - x_j) + n_x t \\ (y_0 - y_j) + n_y t \\ (z_0 - z_j) + n_z t \end{bmatrix} \qquad \text{Eq. 5}$$

Substituting equation 5 into equation 4 gives:

$$(n_x^2+n_y^2+n_z^2)t^2+2)((x_0+x_j)n_x+(y_0+y_j)n_y+(z_0+z_j)n_z)t+ \\ ((x_0+x_j)^2+(y_0+y_j)^2+(z_0+z_j)^2) \geq d_{mel}^2 \qquad \text{Eq. 6}$$

Rearranging gives a quadratic form:

$$(n_x^2+n_y^2+n_z^2)t^2+2((x_0+x_j)n_x+(y_0+y_j)n_y+(z_0+z_j)n_z)t+ \\ ((x_0+x_j)^2+(y_0+y_j)^2+(z_0+z_j)^2)-d_{mel}^2 \geq 0 \quad \text{Eq. 7}$$

Figure 11:
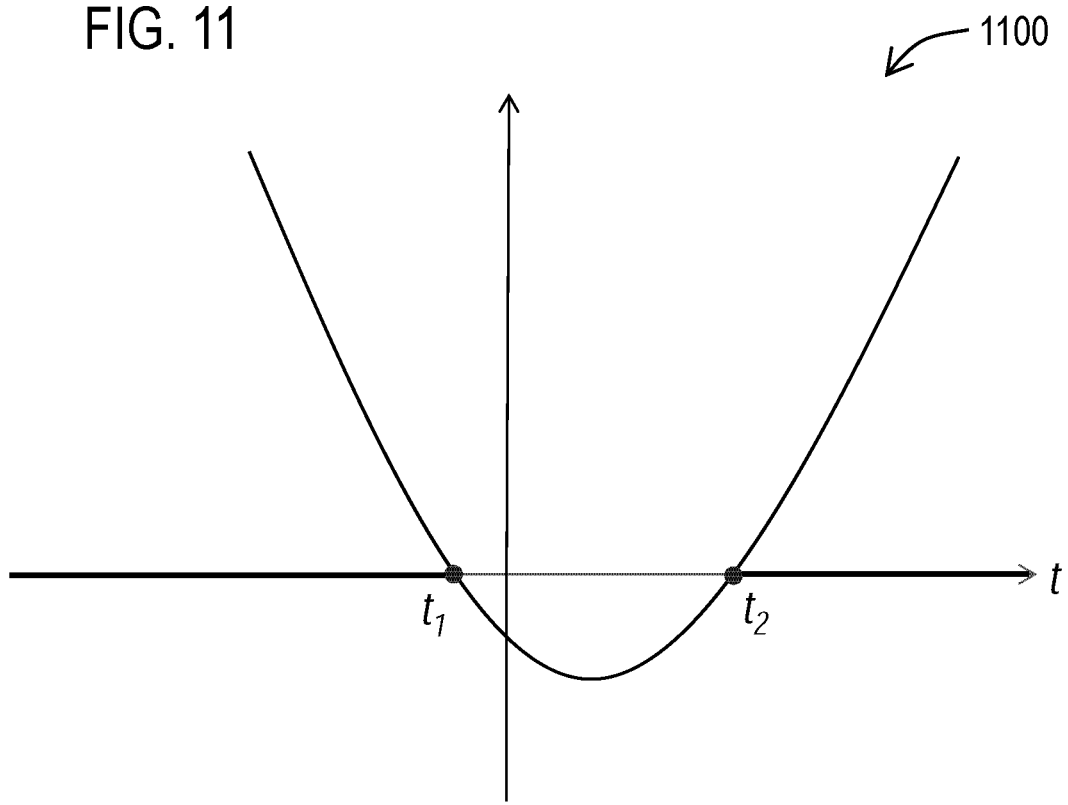
FIG. 11 illustrates a plot of a quadratic used to resolve MEL failures.

FIG. 11 shows an example plot 1100 of this quadratic with roots at $t_1$ and $t_2$.

Consequently, an algorithm for resolving MEL failures and determining the new position of the candidate node using this first approach may correspond to the following steps:
1. Evaluate the mesh and identify element edges whose length $l<d_{mel}$. If no element edges violate MEL, exit. Otherwise go to step 2.
2. Select a candidate node connected to this edge.
3. For all edges extending from the candidate node calculate the roots of equation 7 using the Quadratic Formula.
4. If the discriminant, of the quadratic formula is positive, determine the upper and lower feasible ranges of t for every node, $X_j$: $t<t_{1j}$, $t>t_{2j}$
5. Combine and find the feasible range for t that satisfies all $l>d_{mel}$ constraints: $t<t_{1j}^*$, $t>t_{2j}^*$ Where $t_{1j}^*=\max(t_{1j})$ and $t_{2j}^*=\min(t_{2j})$
6. Select $t^*$ in $\{t_{1j}^*, t_{2j}^*\}$ that minimizes abs(t). For this position, check that each element edge satisfies the condition $l<l_{max}$. Where $l_{max}$ is the maximum element edge length.
7. If the $l_{max}$ condition has been satisfied, update the mesh with the new nodal coordinates.
8. Go to step 1.

The MEL failures which have not been resolved as a result of violating the $l_{max}$ constraint may then become candidates for a second approach carried out by the Node Slider software component 312, in which perturbation of nodes occurs along the shortest edge direction of an edge that is shorter than the desired MEL.

For this second approach of the second stage 306, the at least one processor 102 may be configured (e.g., via the Node Slider software component 312) to move a second subset of the MEL failure nodes to new positions on a respective line that is coincident with a shortest edge connected to the respective node of the second subset being moved in order to cause the shortest edge to have a length that is at least the second predetermined MEL.

Figure 12:
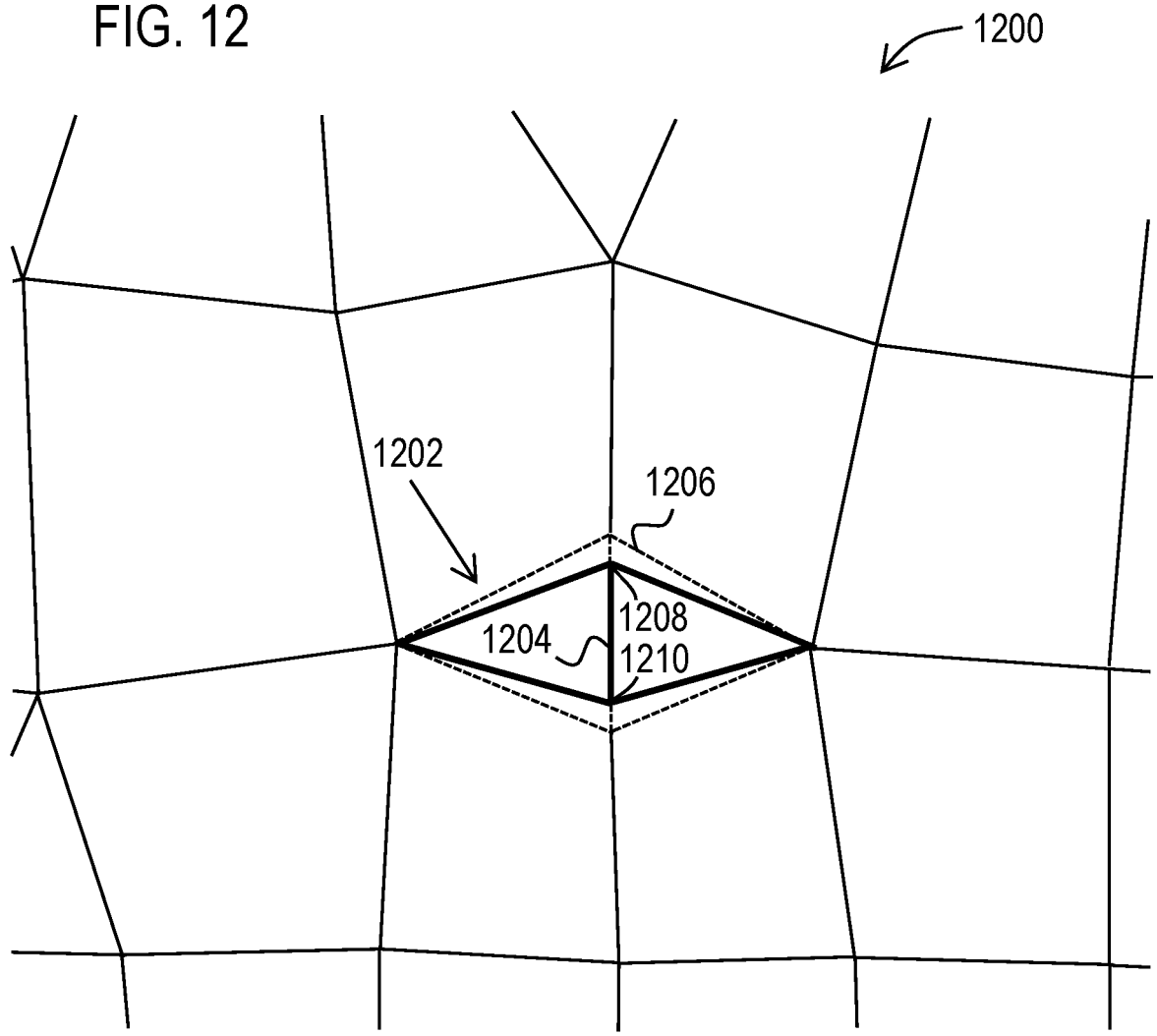
FIG. 12 illustrates edges of a mesh before and after nodes have been moved to remove MEL failures.

FIG. 12 illustrates edges of a mesh 1200 with quadrilateral elements 1202 (that fail MEL), before (in solid bold lines 1204) and after (in broken lines 1206) nodes 1208, 1210 have been moved in this described manner to remove MEL failures.

Figure 13:
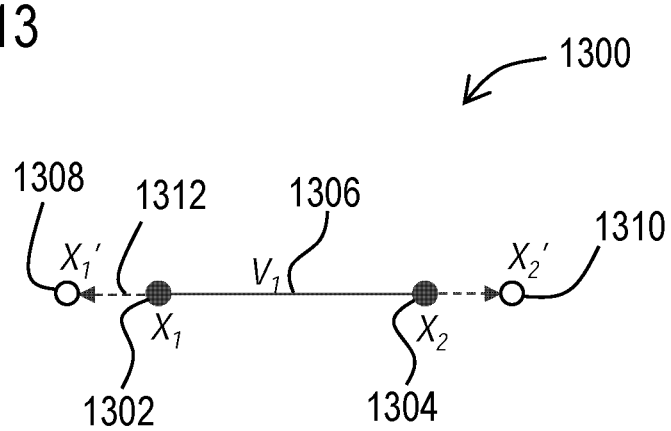
FIG. 13 illustrates movement of two nodes in contact with an element edge to new positions along the direction of the edge.

In this described approach, perturbation of the node may be along shortest edge direction to fix MEL failures. As illustrated with the a mesh 1300 in FIG. 13, this approach moves both nodes $x_1$ 1302 and $x_2$ 1304 in contact with an element edge $V_1$ 1306 (which is initially less than $d_{mel}$) to new positions along a line 1312 coincident with the edge in opposite directions, to positions $X_1'$ 1308 and $X_2'$ 1310 where the final edge length is equal to $d_{mel}$.

These parameters may be defined as shown in equations 8-11 below.

$$V_1 = X_1 - X_2 \quad \text{Eq. 8}$$

$$\delta = \text{abs}\left(\frac{d_{mel} - \|V_1\|}{2}\right) \quad \text{Eq. 9}$$

$$X_1' = X_1 + \delta \overline{V}_1 \quad \text{Eq. 10}$$

$$X_2' = X_2 - \delta \overline{V}_1 \quad \text{Eq. 11}$$

Consequently, an algorithm for resolving MEL failures and determining the new position of the candidate nodes using this further approach described above may correspond to the following steps:
1. Evaluate the mesh and identify element edges whose length $l<d_{mel}$. If no element edges violate MEL, exit. Otherwise go to step 2
2. Select the 2 nodes connected to this edge and compute their new location according to equations 10 and 11 respectively
3. Update the mesh with the new nodal coordinates
4. Go to step 1.

These described approaches of the Node Mover and Node Slider software components are operative to move/slide nodes to positions along surface normals and/or edge directions to lengthen element edges that are less than MEL rather than displacing them normal to the surface normal. As a result, the displacement from geometry (e.g., of the original CAD drawing of the part) may be typically less than 20% of global element size.

For the third stage 402 of the described mesh quality improvement engine, the at least one processor 102 may be configured (via the Angle Optimizer software component 406) to determine that at least one included angle 204 of at least one of the quadrilateral elements is either greater than a predetermined maximum angle or less than a predetermined minimum angle. The processor may also be configured to determine a node for the determined included angle. In addition, the processor may be configured to move in the mesh the node for the determined included angle in a direction of a longest edge connected to the node for the determined included angle such that: all of the included angles associated with the moved node in each of the quadrilateral elements that share the moved node have angles that are not greater than the predetermined maximum angle and are not less than the predetermined minimum angle; and all edges connected to the moved node have lengths that are at least the second predetermined edge length.

Figure 14:
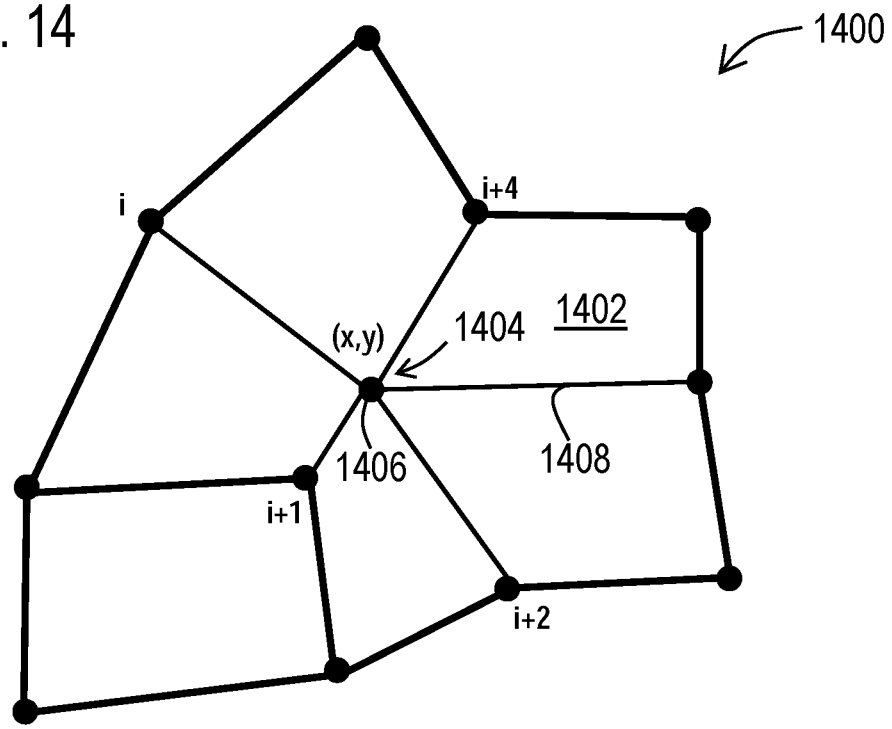
FIG. 14 illustrates an example mesh in which a quadrilateral element includes an included angle that is below a predetermined minimum angle.
Figure 15:
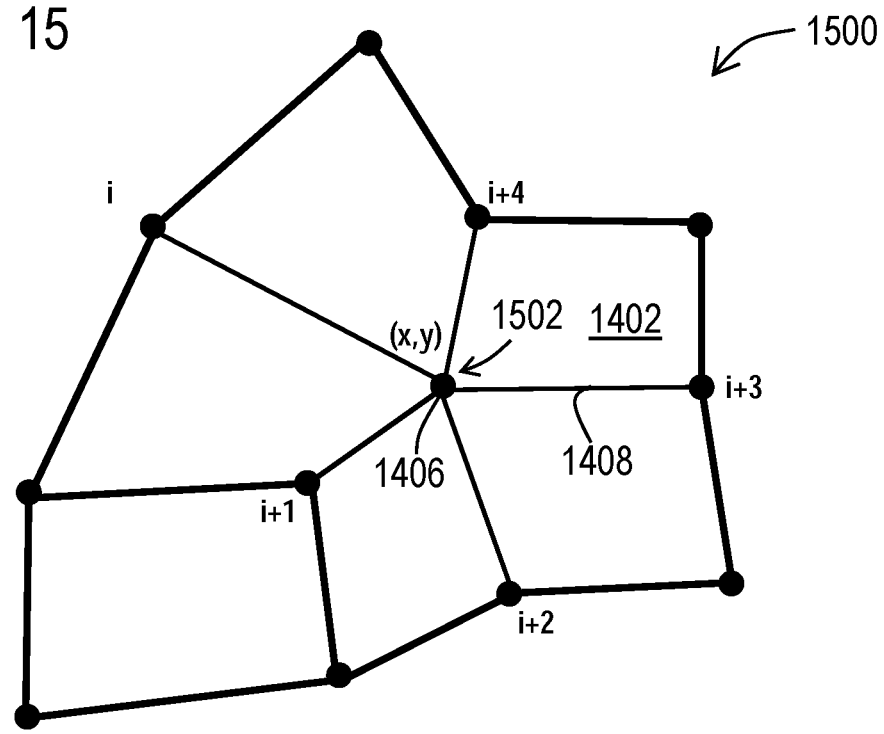
FIG. 15 illustrates an example of a modified mesh after a node has been moved to new positions along the longest connected edge to cause an included angle for a quadrilateral element to satisfy a predetermined minimum angle.

FIG. 14 illustrates an example mesh 1400 in which a quadrilateral element 1402 includes an included angle 1404 at node 1406 that is below a predetermined minimum angle. FIG. 15 illustrates an example of the resulting modified mesh 1500 after the node 1406 has been moved (rightward along longest connected edge 1408) to result in an included angle 1502 for the quadrilateral element 1402 that is no longer below the predetermined minimum angle.

To carry out these functions, the previously described Angle Optimizer software component 406 may carry out angle optimization around a given node in order to minimize the discrepancy between the element included angles which fail the angle limits surrounding a node.

For example, if a node has five flat elements in contact with it, an optimum configuration may be if each angle was 72°. To simply the computation, the angles may be evaluated and optimized on a 2D mesh and transformed back to 3D using a Weighted Half-Edge Method flattening algorithm The Weighted Half-Edge Method for 2D parameterization of a tessellated 3D face may use a compromise between conformal mapping and triangle altitude preservation techniques to generate 2D domains with highly reduced transformational distortion. The meshes are generated in this 2D domain and transformed back to 3D space.

With reference to the mesh 1400 illustrated in FIG. 14, for a given node 1406 with N connected edges, the objective function f(x, y) to be minimized is defined as the average deviation of the included angles surrounding the node from $$\frac{2\pi}{N}$$

according to equation 12.

$$f(x, y) = \frac{\sum_{i=1}^{N-1}\left(abs\left(cos^{-1}\left(\frac{(y_i - y)(y_{i+1} - y) + (x_i - x)(x_{i+1} - x)}{((y_i - y)^2(x_i - x)^2)^{0.5}((y_{i+1} - y)^2(x_{i+1} - x)^2)^{0.5}}\right) - \frac{2\pi}{N}\right)\right)}{N} \quad \text{Eq. 12}$$

The deviation of all element edges from MEL may be evaluated by:

$$c_i(x, y) = ((y_i - y)^2 + (x_i - x)^2)^{0.5} - d_{mel} * sf \quad \text{Eq. 13}$$

where sf is a safety factor such as 1.01.

Thus, the optimization problem may be defined as:

$$\min f(x, y) \quad \text{Eq. 14}$$

Subject to $$c_i(x, y) \geq 0 \; i=1 \ldots N \quad \text{Eq. 15}$$

The solver employed to minimize the objective function subject to the above constraints may be Powell's Conjugate Direction Method. This approach finds the minimum of a function of M variables. For this case M=2. The approach is given an initial estimate which is the x and y values in a unit direction along the longest connected edge from the initial nodal location. This generates an initial set of search vectors. The method minimizes the function by a bi-directional search along each search vector, in turn. The new position can then be expressed as a linear combination of the search vectors. The new displacement vector becomes a new search vector, and is added to the end of the search vector list. Meanwhile, the search vector which contributed most to the new direction, (i.e., the one which was most successful), is deleted from the search vector list. The algorithm iterates an arbitrary number of times until no significant improvement is made. The approach is that no derivatives of the objective function or constraints are required and the underlying algorithm is simple.

Thus, an algorithm for resolving angle failures may correspond to the following:
1. Assess the 2D mesh on a single face for angle failures using the criteria defined in equation 2.
2. If no angle violates the angle limits, defined in equation 2, go to exit. Otherwise, locate the node associated with the failing included angle and compute an initial perturbation in a unit direction along the longest connected edge.
3. Submit this initial estimate to the solver and execute Powell's method as described above.
4. If the algorithm does not converge, go to exit. Otherwise update the new nodal location in the 2d and 3d face mesh.
5. If all faces have been meshed, go to exit. Otherwise, select the next face and go to step 1.

Thus, this described Angle Optimizer software component carries out a process whereby the element angle problem and its constraints are posed as an optimization problem and solved as such. This stage focuses on failed angles and with constraints that are validated in such a way that no MEL failures result from the node movement produced by this software component. As a result, the impact on neighboring element angles is minimized.

For the fourth stage 404 of the described mesh quality improvement engine, the at least one processor 102 may be configured (e.g., via the Warp Smoother software component 408) to determining that a warp of at least one quadrilateral element deviates by more than a predetermined maximum warp. The warp of the at least one quadrilateral element may be determined based on deviation of the at least one quadrilateral element from an orthogonal projection of the at least one quadrilateral element on a mean plane that is based on a determined average of normal corner vectors for four corner nodes of the at least one quadrilateral element. In addition, the at least one processor may be configured to incrementally move in the mesh the corner nodes of the at least one quadrilateral element along the orthogonal projection to positions in which the at least one quadrilateral element has a warp that is at most the predetermined maximum warp.

To carry out these functions, the previously described Warp Smoother software component may setup a cost function to define the warp metric being pursued. A minimization principle may also be worked out to reduce the cost function to an acceptable limit. Goal proximity may be managed by defining error norms and their acceptable ranges. Thus, in an effort to minimize the cost function, the nodes of the mesh may be repositioned either iteratively or thru quasi-static simultaneous equation solve systems.

Figure 16:
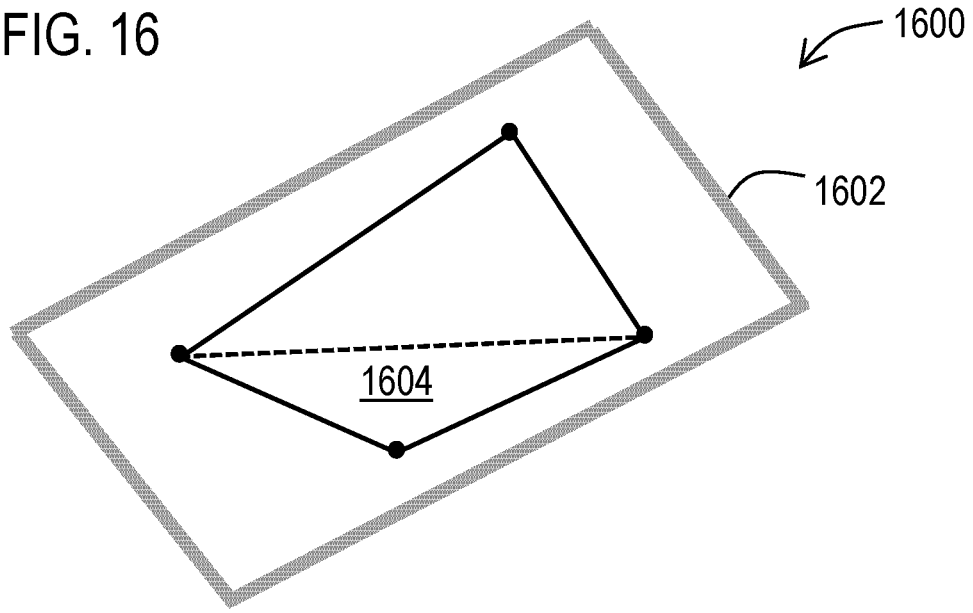
FIG. 16 illustrates a mean plane defined for a quadrilateral element.

With reference to the mesh 1600 illustrated in FIG. 16, since quad warp is caused primarily by non-planarity, a mean plane $P_m$ 1602 may be defined for any given quad element 1604.

Figure 17:
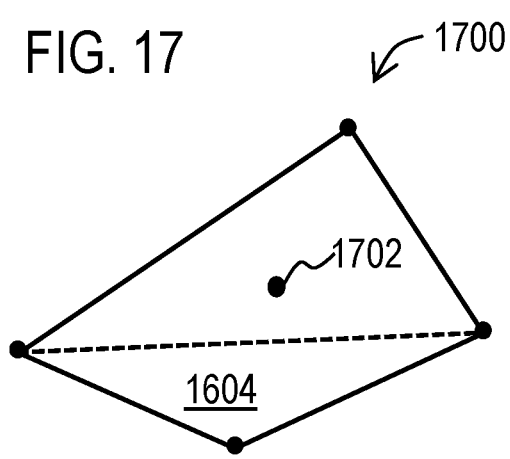
FIG. 17 illustrates a quadrilateral element centroid.
Figure 18:
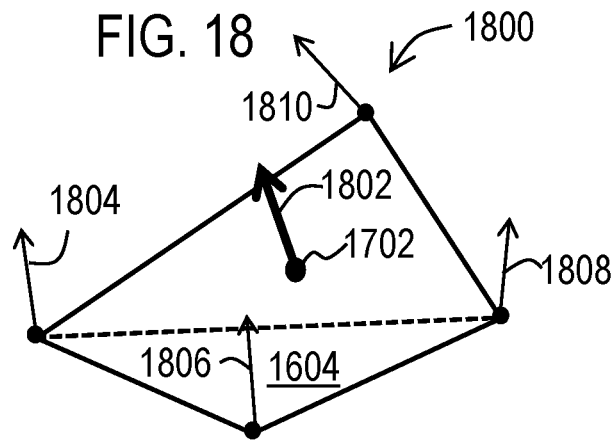
FIG. 18 illustrates a mean normal vector for a quadrilateral element that is the average of four corner normals.

The mean plane $P_m$ may be defined by $$n.(r - r_0) = 0 \quad \text{Eq. 16}$$

Where n=average normal vector of the quadrilateral element and r (a,b,c) is the element centroid 1702 (illustrated in the example 1700 of FIG. 17) while $r_0$ (x,y,z) is the origin of the global coordinate system. As illustrated in the example 1800 of FIG. 18, the mean normal vector 1802 for the quad 1604 may be an average of the four corner normals 1804, 1806, 1808, 1810 and can be written as $$n = \frac{1}{4}\sum_{i=1}^{4} n_i \quad \text{Eq. 17}$$

A local coordinate system (ξ η ξ) may be set up for the mean plane $P_m$ (ξ, η, ξ).

Figure 19:
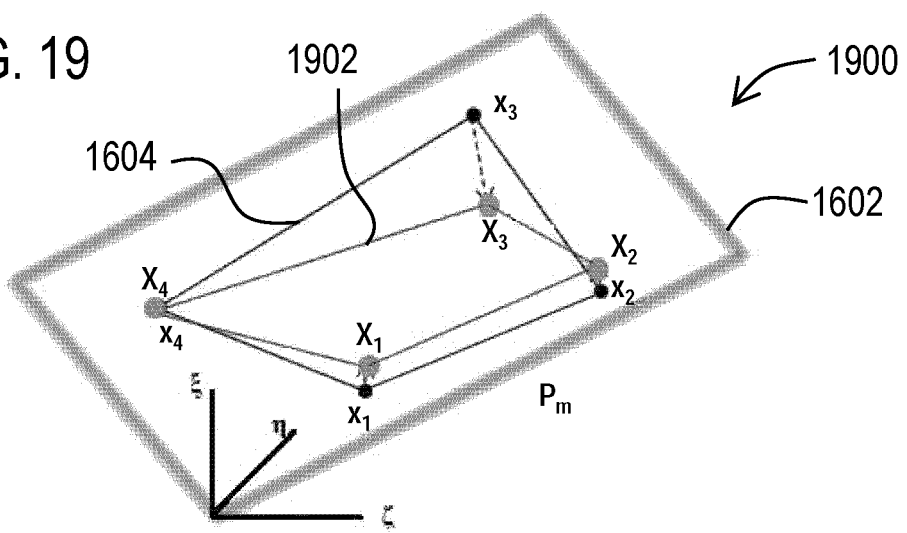
FIG. 19 illustrates an example in which the original quadrilateral element is shown along with its orthogonal projection on a mean plane.

FIG. 19 illustrates an example 1900 in which the original quad element Qi (x1, x2, x3, x4) 1604 is shown along with its orthogonal projection Q'i (X1, X2, X3, X4) 1902 on the mean plane $P_m$ 1602.

The cost function $\Psi$ may be defined as the strain energy E of non-planarity of the quad Qi due to deviation from its mean plane and can be written as $$\varepsilon_i = 1/2 k_i d_i^2 \qquad \text{Eq. 18}$$

where $k_i$=constant, stiffness and average displacement $d_i$ can be expressed as $$d_i = \sum_1^4 (X_j - x_j) \qquad \text{Eq. 19}$$

for the i-th element

The cost function to be minimized for a mesh with N quad elements is thus $$\psi = \sum_{i=1}^{N} \frac{1}{2} k_i d_i^2 \qquad \text{Eq. 20}$$

Minimization happens with respect to the transverse coordinate $\xi$ of the mean plane $P_m$. Here the object may be to minimize the global strain energy of non-planarity such that all out-of-plane quads are returned to a planar position. After minimization the following equation may be derived:

$$\frac{\partial \psi}{\partial \xi} = \sum_{i=1}^{N} (k_i) \cdot \sum_{i=1}^{N} \frac{\partial d_i}{\partial \xi} = 0 \qquad \text{Eq. 21}$$

In example embodiments, the minimization procedure translates to repositioning the corner nodes of each failing quad element along the orthogonal projection or displacement vector $v_j$ until warp passes.

$$v_i = X_{\xi j} - x_{\xi i} \qquad \text{Eq. 22}$$

A 3-tier termination and/or convergence criteria may be set. For example, the iterative solution may be terminated if:
a. No quads in the mesh fail warp;
b. A critical global displacement error norm $\varepsilon_{cr}$ is reached; or
c. A maximum iteration count niter is reached.

The error norm $\varepsilon_r$ for a mesh with N quad elements can be expressed as $$\varepsilon_r = \sum_{l=0}^{n_{iter}} \sum_{k=1}^{N} (d_{kl} - d_{k(l-1)})^2 \qquad \text{Eq. 23}$$

Consequently, the overall algorithm may be described as follows:
1. Cycle all elements in the mesh that fail the warp check for the chosen solver.
2. For each element, compute the element centroid r.
3. Compute the corner normals $n_i$.
4. Compute the average element normal n based on equation 17.
5. Construct element mean plane $P_m$.
6. While (element warp check w>$d_{warp}$):
   6a. Compute orthogonal displacement vector for all j (j=4) element nodes;
   6b. Move each node of the failed element along the orthogonal displacement vector by incremental amount $\Delta v = Kf$ (=0.2)d each time, where d is the distance of orthogonal projection of the node to the mean plane $P_m$; and
   6c. Recalculate warp.
7. End While.
8. Repeat steps 2-7 for all quad elements failing warp in the mesh.
9. Terminate the cycle:
   9a. When no more elements fail warp; or
   9b. The global displacement error norm has converged to a value lower than the error limit; or
   9c. The maximum number of iterations have been reached.

In this example warp w 206 may be determined via a function that reflects the deviation of the plane of the original quadrilateral element relative to its orthogonal projection on the mean plane that intersect the element, such as via the equation:

$$w = 2\frac{h}{(d_1 + d_2)} \qquad \text{Eq. 24}$$

where (as illustrated in FIG. 2) h is the distance between the farthest node on the original quadrilateral element and the orthogonal projection on the mean plane, and $d_1$ and $d_2$ are the distances between opposed nodes of the original quadrilateral element. However, it should be understood that alternative embodiments may be configured to determine an amount of warp based on other calculations that estimate angular deviation between a quadrilateral element and the original surfaces from which the mesh was created.

For the fifth stage 502 of the described mesh quality improvement engine, after the end of warp smoothing in stage 4, if any quadrilateral elements remain that fail the maximum included angle check or the maximum warp limit, they are split into two triangles, provided that the triangles pass the element included angle check.

In this example, the at least one processor 102 may be configured (e.g., via the Quad Splitter software component 506) to determine all remaining quadrilateral elements in the mesh that either: have at least one included angle 204 that is either greater than a predetermined maximum angle or less than a predetermined minimum angle; or have a warp 206 that is greater than the predetermined maximum warp. The at least one processor 102 may also be configured to split the determined remaining quadrilateral elements into triangles that respectively have no included angles that are greater than the predetermined maximum angle or are less than the predetermined minimum angle. The quadrilateral elements may be split along the shortest diagonal unless other constraints exist.

For the sixth stage 504 of the described mesh quality improvement engine, the Mesh Seamer software component 308 may be re-invoked in a more aggressive fashion. If any element edges remain that fail MEL at this stage these edges are collapsed by the Mesh Seamer software component.

In this example, the at least one processor 102 may be configured (e.g., via the Mesh Seamer) to determine all remaining edges of the plurality of quadrilateral elements, having lengths (202) that are shorter than the second predetermined MEL. The at least one processor may then collapse in the mesh the determined remaining edges to convert each quadrilateral element that included a respective collapsed one of the remaining edges into a respective triangular element.

The results of these stages (which may include a subset of the described six stages of the mesh quality improvement engine) is the modified surface mesh 116, in which all quadrilaterals in the modified mesh have edge lengths (202) that are at least the second predetermined MEL (e.g., the desired final MEL for the mesh).

The well-shaped quadrilateral meshes produced by this described process may significantly increase computational efficiency of the downstream finite element solve. This may be desirable for automotive body panel analyses. For example, the efficiency of an automotive crash simulation is highly dependent on the quality of the mesh. In transient dynamic applications such as these, where the solver is time-stepping/explicit, the minimum time step it can cope with is a fraction of the time taken for the speed of sound (i.e., elastic propagation rate through the medium) to cross the smallest element. Consequently, the number of time steps required even for a 2 or 3 second analysis is quite substantial. As a quadrilateral mesh will massively reduce the amount of elements required compared to an equivalent triangular mesh there will be an enormous saving in the time required to converge to a solution. Furthermore, one degenerate triangular element could be so small that the time it takes for the speed of sound to cross the element is infinitesimally small which means an enormous number of time steps are required to converge to a solution. The MEL requirement ensures speedy transient dynamic or response analyses. These problems are directly addressed with the high quality quadrilateral meshes produced by all or at least a portion of the described stages of the mesh quality improvement engine.

The described stages may be invoked in the described operational sequence to address body panel meshes in particular. However, in alternative embodiments, the described stages and sequence can be altered. For example, each of the described software components of the engine may execute independently with several options to control their respective modes of operation. The described mesh quality improvement engine may also be flexible via configurable and pluggable software components.

Example embodiments of the described mesh quality improvement engine may automatically operate on a mesh without manual intervention and inspection of elements in the mesh. The example system may thus avoid the need for a user to fix meshes by editing them, which in general is a time consuming, laborious process requiring a high level of skill and expertise. Example embodiments may provide a more cost-effective solution that is operative to automatically generated meshes of superior quality than manually edited meshes.

Figure 20:
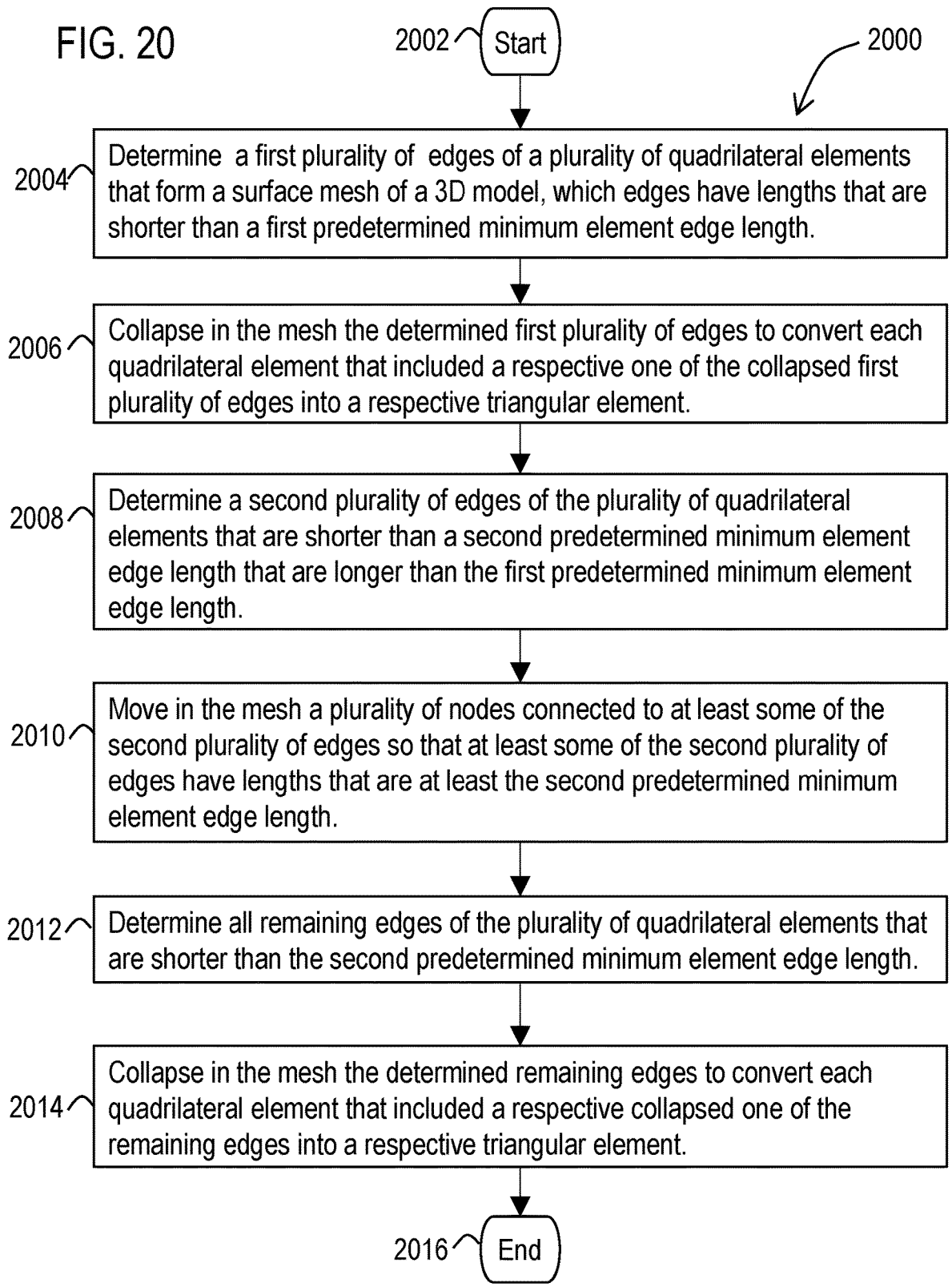
FIG. 20 illustrates a flow diagram of an example methodology that facilitates element quality improvement in 3D quadrilateral-dominant surface meshes.

With reference now to FIG. 20, various example methodologies are illustrated and described. While the methodologies are described as being a series of acts that are performed in a sequence, it is to be understood that the methodologies may not be limited by the order of the sequence. For instance, some acts may occur in a different order than what is described herein. In addition, an act may occur concurrently with another act. Furthermore, in some instances, not all acts may be required to implement a methodology described herein.

It is important to note that while the disclosure includes a description in the context of a fully functional system and/or a series of acts, those skilled in the art will appreciate that at least portions of the mechanism of the present disclosure and/or described acts are capable of being distributed in the form of computer-executable instructions contained within non-transitory machine-usable, computer-usable, or computer-readable medium in any of a variety of forms, and that the present disclosure applies equally regardless of the particular type of instruction or data bearing medium or storage medium utilized to actually carry out the distribution. Examples of non-transitory machine usable/readable or computer usable/readable mediums include: ROMs, EPROMs, magnetic tape, hard disk drives, SSDs, flash memory, CDs, DVDs, and B lu-ray disks. The computer-executable instructions may include a routine, a sub-routine, programs, applications, modules, libraries, and/or the like. Still further, results of acts of the methodologies may be stored in a computer-readable medium, displayed on a display device, and/or the like.

Referring now to FIG. 20, a methodology 2000 is illustrated that facilitates element quality improvement in 3D quadrilateral-dominant surface meshes. The methodology may start at 2002 and may include several acts carried out through operation of at least one processor. These acts may include an act 2004 of determining a first plurality of edges of a plurality of quadrilateral elements that form a surface mesh of a 3D model, which edges have lengths that are shorter than a first predetermined minimum element edge length. Also, these acts may include an act 2006 of collapsing in the mesh the determined first plurality of edges to convert each quadrilateral element that included a respective one of the collapsed first plurality of edges into a respective triangular element. In addition after act 2006, the methodology may include an act 2008 of determining a second plurality of edges of the plurality of quadrilateral elements that are shorter than a second predetermined minimum element edge length that are longer than the first predetermined minimum element edge length. Further, the acts may include an act 2010 of moving in the mesh a plurality of nodes connected to at least some of the second plurality of edges so that at least some of the second plurality of edges have lengths that are at least the second predetermined minimum element edge length. In addition, the acts may include an act 2012 of determining all remaining edges of the plurality of quadrilateral elements that are shorter than the second predetermined minimum element edge length. Also the acts may include an act 2014 of collapsing in the mesh the determined remaining edges to convert each quadrilateral element that included a respective collapsed one of the remaining edges into a respective triangular element. At 2016 the methodology may end.

As a result of these a modified surface mesh may be produced in which all quadrilaterals in the modified mesh have edge lengths that are at least the second predetermined minimum element edge length. However, it should be appreciated that this described methodology may include additional acts and/or alternative acts corresponding to the features described previously with respect to the data processor system 100.

For example, between act 2010 and before act 2012, the methodology may include additional acts associated with adjusting included angles. Such acts may include determining through operation of the at least one processor that at least one included angle of at least one of the quadrilateral elements is either greater than a predetermined maximum angle or less than a predetermined minimum angle. Such acts may also include determining a node for the determined included angle. In addition, these acts may include moving in the mesh the node for the determined included angle in a direction of a longest edge connected to the node for the determined included angle such that all of the included angles associated with the moved node in each of the quadrilateral elements that share the moved node have angles that are not greater than the predetermined maximum angle and are not less than the predetermined minimum angle; and all edges connected to the moved node have lengths that are at least the second predetermined edge length.

Also for example, before act 2012, the methodology may include additional acts associated with warped elements. Such acts may include determining that a warp of at least one quadrilateral element deviates by more than a predetermined maximum warp, wherein the warp of the at least one quadrilateral element is determined based on deviation of the at least one quadrilateral element from an orthogonal projection of the at least one quadrilateral element on a mean plane that is based on a determined average of normal corner vectors for four corner nodes of the at least one quadrilateral element. Such acts may also include incrementally moving in the mesh the corner nodes of the at least one quadrilateral element along the orthogonal projection to positions in which the at least one quadrilateral element has a warp that is at most the predetermined maximum warp.

Also for example, after adjusting the included angles and correcting warped elements and before act 2012, the methodology may include several acts including determining all remaining quadrilateral elements in the mesh that either: have at least one included angle that is either greater than a predetermined maximum angle or less than a predetermined minimum angle; or have a warp that is greater than the predetermined maximum warp. Further, such acts may include splitting the determined remaining quadrilateral elements into triangles that respectively have no included angles that are greater than the predetermined maximum angle or are less than the predetermined minimum angle.

In example embodiments act 2010 may include a first approach to moving at least some of the nodes. Such a first approach may include moving a first subset of such nodes (908, 1002) to new positions along determined respective surface normals for each respective node of the first subset, in order to cause each edge connected to each respective node of the first subset to have a length that is: at least the second predetermined minimum element edge length; and not longer than a largest edge in the quadrilateral elements that include the respective edge prior to the respective node of the first subset being moved.

In example embodiments act 2010 may additionally or alternatively include a second approach to moving at least some of the nodes. Such a second approach may include moving a second subset of the nodes to new positions on a determined respective line that is coincident with a shortest edge connected to the respective node of the second subset being moved in order to cause the shortest edge to have a length that is at least the second predetermined minimum element edge length.

Example embodiments of the described methodology may also include prior to act 2004 generating the surface mesh from a 3D CAD model of a part, wherein a majority of elements in the surface mesh are quadrilateral elements. In addition the methodology may include after act 2014 an act of carrying out a finite element analysis simulation involving the modified surface mesh in order to evaluate how the part changes in response to the simulation.

As discussed previously, acts associated with these methodologies (other than any described manual acts) may be carried out by one or more processors. Such processor(s) may be included in one or more data processing systems, for example, that execute software components (including software instructions) operative to cause these acts to be carried out by the one or more processors. In an example embodiment, such software components may comprise computer-executable instructions corresponding to a routine, a subroutine, programs, applications, modules, libraries, a thread of execution, and/or the like. Further, it should be appreciated that software components may be written in and/or produced by software code/environments/languages/frameworks such as machine code, assembly language, Java, JavaScript, Python, C, C#, C++ or any other software tool capable of producing software components and user interfaces configured to carry out the acts and features described herein.

Figure 21:
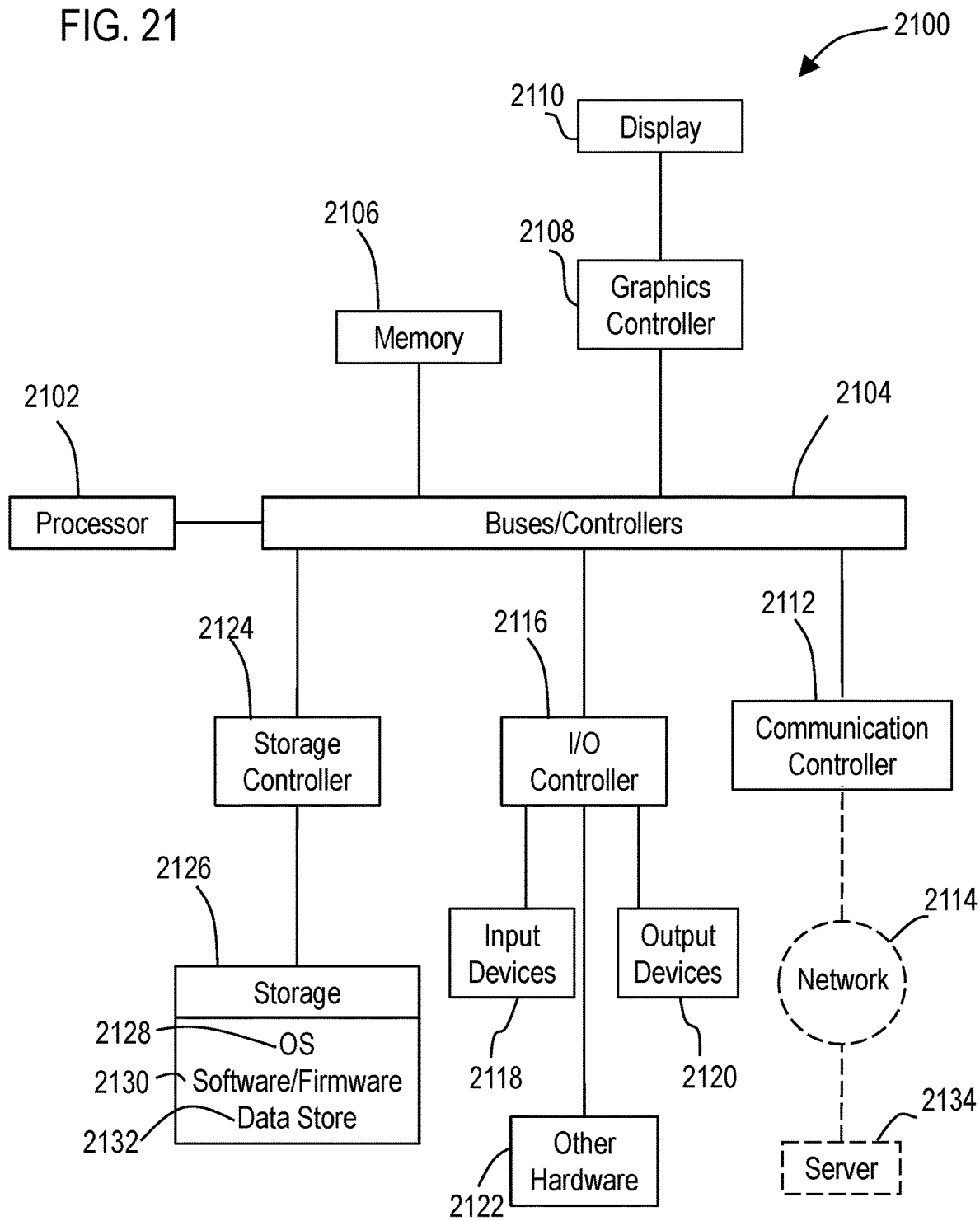
FIG. 21 illustrates a block diagram of a data processing system in which an embodiment may be implemented.

FIG. 21 illustrates a block diagram of a data processing system 2100 (e.g., a computer system) in which an embodiment can be implemented, for example, as a portion of a product system, and/or other system operatively configured by software or otherwise to perform the functions and processes as described herein. The data processing system depicted includes at least one processor 2102 (e.g., a CPU) that may be connected to one or more bridges/controllers/buses 2104 (e.g., a north bridge, a south bridge). One of the buses 2104, for example, may include one or more I/O buses such as a PCI Express bus. Also connected to various buses in the depicted example may include a main memory 2106 (RAM) and a graphics controller 2108. The graphics controller 2108 may be connected to one or more display devices 2110. It should also be noted that the processor 2102 may include a CPU cache memory. Further, in some embodiments one or more controllers (e.g., graphics, south bridge) may be integrated with the CPU (on the same chip or die). Examples of CPU architectures include IA-32, x86-64, and ARM processor architectures.

Other peripherals connected to one or more buses may include communication controllers 2112 (Ethernet controllers, WiFi controllers, cellular controllers) operative to connect to a local area network (LAN), Wide Area Network (WAN), a cellular network, and/or other wired or wireless networks 2114 or communication equipment.

Further components connected to various busses may include one or more I/O controllers 2116 such as USB controllers, Bluetooth controllers, and/or dedicated audio controllers (connected to speakers and/or microphones). It should also be appreciated that various peripherals may be connected to the I/O controller(s) (via various ports and connections) including input devices 2118 (e.g., keyboard, mouse, pointer, touch screen, touch pad, drawing tablet, trackball, buttons, keypad, game controller, gamepad, camera, microphone, scanners, motion sensing devices that capture motion gestures), output devices 2120 (e.g., printers, speakers) or any other type of device that is operative to provide inputs to or receive outputs from the data processing system.

Also, it should be appreciated that many devices referred to as input devices or output devices may both provide inputs and receive outputs of communications with the data processing system. For example, the processor 2102 may be integrated into a housing (such as a tablet) that includes a touch screen that serves as both an input and display device. Further, it should be appreciated that some input devices (such as a laptop) may include a plurality of different types of input devices (e.g., touch screen, touch pad, and keyboard). Also, it should be appreciated that other peripheral hardware 2122 connected to the I/O controllers 2116 may include any type of device, machine, or component that is configured to communicate with a data processing system.

Additional components connected to various busses may include one or more storage controllers 2124 (e.g., SATA). A storage controller may be connected to a storage device 2126 such as one or more storage drives and/or any associated removable media, which can be any suitable non-transitory machine usable or machine readable storage medium. Examples, include nonvolatile devices, volatile devices, read only devices, writable devices, ROMs, EPROMs, magnetic tape storage, floppy disk drives, hard disk drives, solid-state drives (SSDs), flash memory, optical disk drives (CDs, DVDs, Blu-ray), and other known optical, electrical, or magnetic storage devices drives and/or computer media. Also in some examples, a storage device such as an SSD may be connected directly to an I/O bus 2104 such as a PCI Express bus.

A data processing system in accordance with an embodiment of the present disclosure may include an operating system 2128, software/firmware 2130, and data stores 2132 (that may be stored on a storage device 2126 and/or the memory 2106). Such an operating system may employ a command line interface (CLI) shell and/or a graphical user interface (GUI) shell. The GUI shell permits multiple display windows to be presented in the graphical user interface simultaneously, with each display window providing an interface to a different application or to a different instance of the same application. A cursor or pointer in the graphical user interface may be manipulated by a user through a pointing device such as a mouse or touch screen. The position of the cursor/pointer may be changed and/or an event, such as clicking a mouse button or touching a touch screen, may be generated to actuate a desired response. Examples of operating systems that may be used in a data processing system may include Microsoft Windows, Linux, UNIX, iOS, and Android operating systems. Also, examples of data stores include data files, data tables, relational database (e.g., Oracle, Microsoft SQL Server), database servers, or any other structure and/or device that is capable of storing data, which is retrievable by a processor.

The communication controllers 2112 may be connected to the network 2114 (which may or may not be a part of a data processing system 2100), which can be any local, wide area, remote, private, and/or public data processing system network or combination of networks, as known to those of skill in the art, including the Internet. Data processing system 2100 can communicate over the network 2114 with one or more other data processing systems such as a server 2134 (which may in combination correspond to a larger data processing system). For example, a larger data processing system may correspond to a plurality of smaller data processing systems implemented as part of a distributed system in which processors associated with several smaller data processing systems may be in communication by way of one or more network connections and may collectively perform tasks described as being performed by a single larger data processing system. Thus, it is to be understood that when referring to a data processing system, such a system may be implemented across several data processing systems organized in a distributed system in communication with each other via a network.

It should also be understood that the term "controller" means any device, system or part thereof that controls at least one operation, whether such a device is implemented in hardware, firmware, software or any combination thereof. It should be noted that the functionality associated with any particular controller may be centralized or distributed, whether locally or remotely. The described processor and memory may be included in a controller. Further, a controller may correspond to the described data processing system or any other hardware circuit that is operative to control at least one operation.

In addition, it should be appreciated that data processing systems may include virtual machines in a virtual machine architecture or cloud environment. For example, the processor 2102 and associated components may correspond to the combination of one or more virtual machine processors of a virtual machine operating in one or more physical processors of a physical data processing system. Examples of virtual machine architectures include VMware ESCi, Microsoft Hyper-V, Xen, and KVM.

Those of ordinary skill in the art will appreciate that the hardware depicted for the data processing system may vary for particular implementations. For example, the data processing system 2100 in this example may correspond to a controller, computer, workstation, server, PC, notebook computer, tablet, mobile phone, and/or any other type of apparatus/system that is operative to process data and carry out functionality and features described herein associated with the operation of a data processing system, computer, processor, software components, and/or a controller discussed herein. The depicted example is provided for the purpose of explanation only and is not meant to imply architectural limitations with respect to the present disclosure.

Also, it should be noted that the processor described herein may correspond to a remote processor located in a data processing system such as a server that is remote from the display and input devices described herein. In such an example, the described display device and input device may be included in a client data processing system (which may have its own processor) that communicates with the server (which includes the remote processor) through a wired or wireless network (which may include the Internet). In some embodiments, such a client data processing system, for example, may execute a remote desktop application or may correspond to a portal device that carries out a remote desktop protocol with the server in order to send inputs from an input device to the server and receive visual information from the server to display through a display device. Examples of such remote desktop protocols include Teradici's PCoIP, Microsoft's RDP, and the RFB protocol. In another example, such a client data processing system may execute a web browser or thin client application. Inputs from the user may be transmitted from the web browser or thin client application to be evaluated on the server, rendered by the server, and an image (or series of images) sent back to the client data processing system to be displayed by the web browser or thin client application. Also in some examples, the remote processor described herein may correspond to a combination of a virtual processor of a virtual machine executing in a physical processor of the server.

Also, as used herein a processor corresponds to any electronic device that is configured via hardware circuits, software, and/or firmware to process data. For example, processors described herein may correspond to one or more (or a combination) of a microprocessor, CPU, FPGA, ASIC, or any other integrated circuit (IC) or other type of circuit that is capable of processing data in a data processing system, which may have the form of a controller board, computer, server, mobile phone, and/or any other type of electronic device. Further the phrase "at least one" before an element (e.g., a processor) that is configured to carry out more than one function/process may correspond to one or more elements (e.g., processors) that each carry out the functions/processes and may also correspond to two or more of the elements (e.g., processors) that respectively carry out different ones of the one or more different functions/processes.

Also, at least one processor that is "configured to" carry out one or more functions or processes is defined herein as the combination of the at least one processor and the particular software/firmware instructions and/or wired circuits that when executed/operated by the at least one processor cause the at least one processor to carry out the one or more functions or processes described or recited herein. For example, a processor that is configured to carry out a particular function/process may correspond to the combination of the processor and the software/firmware instructions in which the processor is actively executing at least portions of the software/firmware instructions that are loaded into a volatile memory (e.g., RAM, CPU cache) and that are programmed to cause the processor to carry out the described or recited function/process. In addition, a processor that is configured to carry out a particular function/process may correspond to the combination of the processor and the software/firmware instructions in which the software/firmware instructions are stored in a non-volatile memory (e.g., flash memory, SSD, hard drive, or other storage device) in operative connection with the processor such that the software/firmware instructions are available to be accessed and executed by the processor to carry out the described function/process (even though none, or only portions of the software/firmware instructions are currently being executed by the processor).

As used herein, the terms "component" and "system" are intended to encompass hardware, software, or a combination of hardware and software. Thus, for example, a system or component may be a process, a process executing on a processor, or a processor. Additionally, a component or system may be localized on a single device or distributed across several devices.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of the data processing system 2100 may conform to any of the various current implementations and practices known in the art.

Also, it should be understood that the words or phrases used herein should be construed broadly, unless expressly limited in some examples. For example, the terms "include" and "comprise," as well as derivatives thereof, mean inclusion without limitation. The singular forms "a", "an" and "the" are intended to include the plural forms as well, unless the context clearly indicates otherwise. Further, the term "and/or" as used herein refers to and encompasses any and all possible combinations of one or more of the associated listed items. The term "or" is inclusive, meaning and/or, unless the context clearly indicates otherwise. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Also, although the terms "first", "second", "third" and so forth may be used herein to refer to various elements, information, functions, or acts, these elements, information, functions, or acts should not be limited by these terms. Rather these numeral adjectives are used to distinguish different elements, information, functions or acts from each other. For example, a first element, information, function, or act could be termed a second element, information, function, or act, and, similarly, a second element, information, function, or act could be termed a first element, information, function, or act, without departing from the scope of the present disclosure.

In addition, the term "adjacent to" may mean: that an element is relatively near to but not in contact with a further element; or that the element is in contact with the further portion, unless the context clearly indicates otherwise.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, act, or function is an essential element, which must be included in the claim scope: the scope of patented subject matter is defined only by the allowed claims. Moreover, none of these claims are intended to invoke a means plus function claim construction unless the exact words "means for" are followed by a participle.

What is claimed is:

1. A system for element quality improvement in three-dimensional (3D) quadrilateral-dominant surface meshes comprising:
at least one processor configured to:
determine a first plurality of edges of a plurality of quadrilateral elements that form a surface mesh of a 3D model, which edges have lengths that are shorter than a first predetermined minimum element edge length;
collapse in the mesh the determined first plurality of edges to convert each quadrilateral element that included a respective one of the collapsed first plurality of edges into a respective triangular element;
after the first plurality of edges are collapsed, determine a second plurality of edges of the plurality of quadrilateral elements that are shorter than a second predetermined minimum element edge length and that are longer than the first predetermined minimum element edge length;
move in the mesh a plurality of nodes connected to at least some of the second plurality of edges so that at least some of the second plurality of edges have lengths that are at least the second predetermined minimum element edge length;
determine all remaining edges of the plurality of quadrilateral elements that are shorter than the second predetermined minimum element edge length; and
collapse in the mesh the determined remaining edges to convert each quadrilateral element that included a respective collapsed one of the remaining edges into a respective triangular element,
whereby a modified surface mesh is produced in which all quadrilaterals in the modified mesh have edge lengths that are at least the second predetermined minimum element edge length.

2. The system according to claim 1, wherein prior to determining all remaining edges of the plurality of quadrilateral elements that are shorter than the second predetermined minimum element edge length, the at least one processor is configured to:

determine that at least one included angle of at least one of the quadrilateral elements is either greater than a predetermined maximum angle or less than a predetermined minimum angle, determine a node for the determined included angle, move in the mesh the node for the determined included angle in a direction of a longest edge connected to the node for the determined included angle such that:

all of the included angles associated with the moved node in each of the quadrilateral elements that share the moved node have angles that are not greater than the predetermined maximum angle and are not less than the predetermined minimum angle; and all edges connected to the moved node have lengths that are at least the second predetermined edge length.

3. The system according to claim 1, wherein prior to determining all remaining edges of the plurality of quadrilateral elements that are shorter than the second predetermined minimum element edge length, the at least one processor is configured to:

determine that a warp of at least one quadrilateral element deviates by more than a predetermined maximum warp, wherein the warp of the at least one quadrilateral element is determined based on deviation of the at least one quadrilateral element from an orthogonal projection of the at least one quadrilateral element on a mean plane that is based on a determined average of normal corner vectors for four corner nodes of the at least one quadrilateral element;

incrementally move in the mesh the corner nodes of the at least one quadrilateral element along the orthogonal projection to positions in which the at least one quadrilateral element has a warp that is at most the predetermined maximum warp.

4. The system according to claim 1, wherein prior to determining all remaining edges of the plurality of quadrilateral elements that are shorter than the second predetermined minimum element edge length, the at least one processor is configured to:

determine all remaining quadrilateral elements in the mesh that either:

have at least one included angle that is either greater than a predetermined maximum angle or less than a predetermined minimum angle; or have a warp that is greater than a predetermined maximum warp; and split the determined remaining quadrilateral elements into triangles that respectively have no included angles that are greater than the predetermined maximum angle or are less than the predetermined minimum angle.

5. The system according to claim 1, wherein to move in the mesh the plurality of nodes connected to at least some of the second plurality of edges, the at least one processor is configured to move a first subset of such nodes to new positions along determined respective surface normals for each respective node of the first subset, in order to cause each edge connected to each respective node of the first subset to have a length that is:

at least the second predetermined minimum element edge length; and not longer than a largest edge in the quadrilateral elements that include the respective edge prior to the respective node of the first subset being moved.

6. The system according to claim 5, wherein to move in the mesh the plurality of nodes connected to at least some of the second plurality of edges, the at least one processor is configured to move a second subset of the nodes to new positions on a determined respective line that is coincident with a shortest edge connected to the respective node of the second subset being moved in order to cause the shortest edge to have a length that is at least the second predetermined minimum element edge length.

7. The system according to claim 1, wherein the at least one processor is configured to generate the surface mesh from a 3D CAD model of a part, wherein a majority of elements in the surface mesh are quadrilateral elements, where the at least one processor is configured to carry out a finite element analysis simulation involving the modified surface mesh in order to evaluate how the part changes in response to the simulation.

8. A method for element quality improvement in three-dimensional (3D) quadrilateral-dominant surface meshes comprising:

through operation of at least one processor:

determining a first plurality of edges of a plurality of quadrilateral elements that form a surface mesh of a 3D model, which edges have lengths that are shorter than a first predetermined minimum element edge length;

collapsing in the mesh the determined first plurality of edges to convert each quadrilateral element that included a respective one of the collapsed first plurality of edges into a respective triangular element;

after the first plurality of edges are collapsed, determining a second plurality of edges of the plurality of quadrilateral elements that are shorter than a second predetermined minimum element edge length that are longer than the first predetermined minimum element edge length;

moving in the mesh a plurality of nodes connected to at least some of the second plurality of edges so that at least some of the second plurality of edges have lengths that are at least the second predetermined minimum element edge length;

determining all remaining edges of the plurality of quadrilateral elements that are shorter than the second predetermined minimum element edge length; and collapsing in the mesh the determined remaining edges to convert each quadrilateral element that included a respective collapsed one of the remaining edges into a respective triangular element, whereby a modified surface mesh is produced in which all quadrilaterals in the modified mesh have edge lengths that are at least the second predetermined minimum element edge length.

9. The method according to claim 8, wherein prior to determining all remaining edges of the plurality of quadrilateral elements that are shorter than the second predetermined minimum element edge length, further comprising through operation of the at least one processor:

determining that at least one included angle of at least one of the quadrilateral elements is either greater than a predetermined maximum angle or less than a predetermined minimum angle, determining a node for the determined included angle, moving in the mesh the node for the determined included angle in a direction of a longest edge connected to the node for the determined included angle such that:

all of the included angles associated with the moved node in each of the quadrilateral elements that share the moved node have angles that are not greater than the predetermined maximum angle and are not less than the predetermined minimum angle; and and all edges connected to the moved node have lengths that are at least the second predetermined edge length.

10. The method according to claim 8, wherein prior to determining all remaining edges of the plurality of quadrilateral elements that are shorter than the second predetermined minimum element edge length, further comprising through operation of the at least one processor:

determining that a warp of at least one quadrilateral element deviates by more than a predetermined maximum warp, wherein the warp of the at least one quadrilateral element is determined based on deviation of the at least one quadrilateral element from an orthogonal projection of the at least one quadrilateral element on a mean plane that is based on a determined average of normal corner vectors for four corner nodes of the at least one quadrilateral element;

incrementally moving in the mesh the corner nodes of the at least one quadrilateral element along the orthogonal projection to positions in which the at least one quadrilateral element has a warp that is at most the predetermined maximum warp.

11. The method according to claim 8, wherein prior to determining all remaining edges of the plurality of quadrilateral elements that are shorter than the second predetermined minimum element edge length, further comprising through operation of the at least one processor:

determining all remaining quadrilateral elements in the mesh that either:

have at least one included angle that is either greater than a predetermined maximum angle or less than a predetermined minimum angle; or have a warp that is greater than a predetermined maximum warp; and splitting the determined remaining quadrilateral elements into triangles that respectively have no included angles that are greater than the predetermined maximum angle or are less than the predetermined minimum angle.

12. The method according to claim 8, wherein moving in the mesh the plurality of nodes connected to at least some of the second plurality of edges includes moving a first subset of such nodes to new positions along determined respective surface normals for each respective node of the first subset, in order to cause each edge connected to each respective node of the first subset to have a length that is:

at least the second predetermined minimum element edge length; and not longer than a largest edge in the quadrilateral elements that include the respective edge prior to the respective node of the first subset being moved.

13. The method according to claim 12, wherein moving in the mesh the plurality of nodes connected to at least some of the second plurality of edges includes moving a second subset of the nodes to new positions on a determined respective line that is coincident with a shortest edge connected to the respective node of the second subset being moved in order to cause the shortest edge to have a length that is at least the second predetermined minimum element edge length.

14. The method according to claim 8, further comprising through operation of the at least one processor:

prior to determining the first plurality of edges, generating the surface mesh from a 3D CAD model of a part, wherein a majority of elements in the surface mesh are quadrilateral elements; and subsequent to collapsing the determined remaining edges, carrying out a finite element analysis simulation involving the modified surface mesh in order to evaluate how the part changes in response to the simulation.

15. A non-transitory computer readable medium encoded with executable instructions that, when executed, cause at least one processor to:

determine a first plurality of edges of a plurality of quadrilateral elements that form a surface mesh of a 3D model, which edges have lengths that are shorter than a first predetermined minimum element edge length;

collapse in the mesh the determined first plurality of edges to convert each quadrilateral element that included a respective one of the collapsed first plurality of edges into a respective triangular element:

after the first plurality of edges are collapsed, determine a second plurality of edges of the plurality of quadrilateral elements that are shorter than a second predetermined minimum element edge length and that are longer than the first predetermined minimum element edge length;

move in the mesh a plurality of nodes connected to at least some of the second plurality of edges so that at least some of the second plurality of edges have lengths that are at least the second predetermined minimum element edge length;

determine all remaining edges of the plurality of quadrilateral elements that are shorter than the second predetermined minimum element edge length; and collapse in the mesh the determined remaining edges to convert each quadrilateral element that included a respective collapsed one of the remaining edges into a respective triangular element, whereby a modified surface mesh is produced in which all quadrilaterals in the modified mesh have edge lengths that are at least the second predetermined minimum element edge length.

16. The non-transitory computer readable medium of claim 15, wherein the executable instructions, when executed, further cause the at least one processor to, prior to determining all remaining edges of the plurality of quadrilateral elements that are shorter than the second predetermined minimum element edge length:

determine that at least one included angle of at least one of the quadrilateral elements is either greater than a predetermined maximum angle or less than a predetermined minimum angle, determine a node for the determined included angle, move in the mesh the node for the determined included angle in a direction of a longest edge connected to the node for the determined included angle such that:

all of the included angles associated with the moved node in each of the quadrilateral elements that share the moved node have angles that are not greater than the predetermined maximum angle and are not less than the predetermined minimum angle; and all edges connected to the moved node have lengths that are at least the second predetermined edge length.

17. The non-transitory computer readable medium of claim 15, wherein the executable instructions, when executed, further cause the at least one processor to, prior to determining all remaining edges of the plurality of quadrilateral elements that are shorter than the second predetermined minimum element edge length:

determine that a warp of at least one quadrilateral element deviates by more than a predetermined maximum warp, wherein the warp of the at least one quadrilateral element is determined based on deviation of the at least one quadrilateral element from an orthogonal projection of the at least one quadrilateral element on a mean plane that is based on a determined average of normal corner vectors for four corner nodes of the at least one quadrilateral element;

incrementally move in the mesh the corner nodes of the at least one quadrilateral element along the orthogonal projection to positions in which the at least one quadrilateral element has a warp that is at most the predetermined maximum warp.

18. The non-transitory computer readable medium of claim 15, wherein the executable instructions, when executed, further cause the at least one processor to, prior to determining all remaining edges of the plurality of quadrilateral elements that are shorter than the second predetermined minimum element edge length:

determine all remaining quadrilateral elements in the mesh that either:

have at least one included angle that is either greater than a predetermined maximum angle or less than a predetermined minimum angle; or have a warp that is greater than a predetermined maximum warp; and split the determined remaining quadrilateral elements into triangles that respectively have no included angles that are greater than the predetermined maximum angle or are less than the predetermined minimum angle.

19. The non-transitory computer readable medium of claim 15, wherein the executable instructions, when executed, cause the at least one processor to move in the mesh the plurality of nodes connected to at least some of the second plurality of edges by moving a first subset of such nodes to new positions along determined respective surface normals for each respective node of the first subset, in order to cause each edge connected to each respective node of the first subset to have a length that is:

at least the second predetermined minimum element edge length; and not longer than a largest edge in the quadrilateral elements that include the respective edge prior to the respective node of the first subset being moved.

20. The non-transitory computer readable medium of claim 19, wherein the executable instructions, when executed, further cause the at least one processor to wherein the executable instructions, when executed, cause the at least one processor to move in the mesh the plurality of nodes connected to at least some of the second plurality of edges by moving a second subset of the nodes to new positions on a determined respective line that is coincident with a shortest edge connected to the respective node of the second subset being moved in order to cause the shortest edge to have a length that is at least the second predetermined minimum element edge length.

* * * * *